United States Patent
Hung et al.

(10) Patent No.: US 11,611,039 B2
(45) Date of Patent: *Mar. 21, 2023

(54) RESISTIVE RANDOM ACCESS MEMORY DEVICE

(71) Applicant: Taiwan Semiconductor Manufacturing Co., Ltd., Hsinchu (TW)

(72) Inventors: Tsai-Hao Hung, Hsinchu (TW); Shih-Chi Kuo, Yangmei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/405,907

(22) Filed: Aug. 18, 2021

(65) Prior Publication Data

US 2021/0384423 A1 Dec. 9, 2021

Related U.S. Application Data

(63) Continuation of application No. 16/834,232, filed on Mar. 30, 2020, now Pat. No. 11,107,986, which is a
(Continued)

(51) Int. Cl.
*G11C 11/00* (2006.01)
*H01L 45/00* (2006.01)
(Continued)

(52) U.S. Cl.
CPC ...... *H01L 45/1253* (2013.01); *G11C 13/0007* (2013.01); *H01L 27/2436* (2013.01);
(Continued)

(58) Field of Classification Search
CPC ............. H01L 45/1253; H01L 27/2436; H01L 45/085; H01L 45/143; H01L 45/146;
(Continued)

(56) References Cited

U.S. PATENT DOCUMENTS 7,528,405 B2   5/2009  Rinerson
9,209,392 B1 * 12/2015  Sung ................... H01L 45/1273
(Continued)

FOREIGN PATENT DOCUMENTS

JP     2009004785 A    1/2009
JP     2009146943      7/2009
(Continued)

OTHER PUBLICATIONS

Official Action dated Jul. 2, 2019, in corresponding Taiwan Patent Application No. 10820606060.

*Primary Examiner* — Tuan T Nguyen
(74) *Attorney, Agent, or Firm* — Duane Morris LLP

(57) ABSTRACT

A memory includes: a first electrode comprising a top boundary and a sidewall; a resistive material layer, disposed above the first electrode, that comprises at least a first portion and a second portion coupled to a first end of the first portion, wherein the resistive material layer presents a variable resistance value; and a second electrode disposed above the resistive material layer.

20 Claims, 18 Drawing Sheets

Related U.S. Application Data continuation of application No. 16/378,299, filed on Apr. 8, 2019, now Pat. No. 10,636,965, which is a continuation of application No. 15/965,881, filed on Apr. 28, 2018, now Pat. No. 10,276,791.

(60) Provisional application No. 62/592,207, filed on Nov. 29, 2017.

(51) Int. Cl.
*G11C 13/00* (2006.01)
*H01L 27/24* (2006.01)

(52) U.S. Cl.
CPC .......... *H01L 45/085* (2013.01); *H01L 45/124* (2013.01); *H01L 45/14* (2013.01); *H01L 45/143* (2013.01); *H01L 45/146* (2013.01); *H01L 45/147* (2013.01); *H01L 45/1616* (2013.01); *H01L 45/1625* (2013.01); *H01L 45/1675* (2013.01); *G11C 2213/32* (2013.01); *H01L 45/1206* (2013.01)

(58) Field of Classification Search
CPC .............. H01L 45/147; H01L 45/1675; H01L 45/1206; H01L 45/124; H01L 45/14; H01L 45/1616; H01L 45/1625; G11C 13/0007; G11C 2213/32

See application file for complete search history.

(56) References Cited

U.S. PATENT DOCUMENTS

| | | | |
|---|---|---|---|
| 9,806,256 B1 | 10/2017 | Wu | |
| 10,050,197 B2 | 8/2018 | Tu | |
| 10,163,979 B2 | 12/2018 | Tran | |
| 10,276,791 B1 | 4/2019 | Hung | |
| 11,107,986 B2 * | 8/2021 | Hung | ................. G11C 13/0007 |
| 2001/0028065 A1 | 10/2001 | Io | |
| 2008/0093591 A1 | 4/2008 | Khang et al. | |
| 2008/0315174 A1 | 12/2008 | Kang et al. | |
| 2010/0219392 A1 | 9/2010 | Awaya et al. | |
| 2011/0291064 A1 | 12/2011 | Marsh et al. | |
| 2013/0193396 A1 | 8/2013 | Nakano | |
| 2014/0322862 A1 | 10/2014 | Xie | |
| 2015/0137059 A1 | 5/2015 | Chen et al. | |
| 2015/0194602 A1 * | 7/2015 | Liao | ........ H01L 45/08 257/4 |
| 2015/0295172 A1 | 10/2015 | Sung et al. | |
| 2016/0104838 A1 | 4/2016 | Park et al. | |
| 2017/0084828 A1 * | 3/2017 | Hsu | ......... G11C 11/16 |
| 2017/0207387 A1 | 7/2017 | Yang et al. | |
| 2017/0317140 A1 | 11/2017 | Wicklein | |
| 2018/0358557 A1 | 12/2018 | Jung | |
| 2018/0375023 A1 | 12/2018 | Song | |
| 2019/0006422 A1 | 1/2019 | Park | |
| 2019/0165256 A1 * | 5/2019 | Tien | ......... H01L 43/08 |
| 2019/0165269 A1 * | 5/2019 | Ando | ................. H01L 45/1273 |
| 2019/0214559 A1 * | 7/2019 | Clarke | ............. H01L 27/2463 |
| 2020/0027924 A1 * | 1/2020 | Yang | .................. H01L 27/2463 |
| 2020/0075857 A1 * | 3/2020 | Chou | .................. H01L 45/1675 |
| 2020/0119268 A1 * | 4/2020 | Sung | ...................... H01L 45/16 |

FOREIGN PATENT DOCUMENTS

| | | |
|---|---|---|
| KR | 20130000428 | 1/2013 |
| KR | 20170043495 | 4/2017 |
| KR | 1020170085411 A | 7/2017 |

* cited by examiner

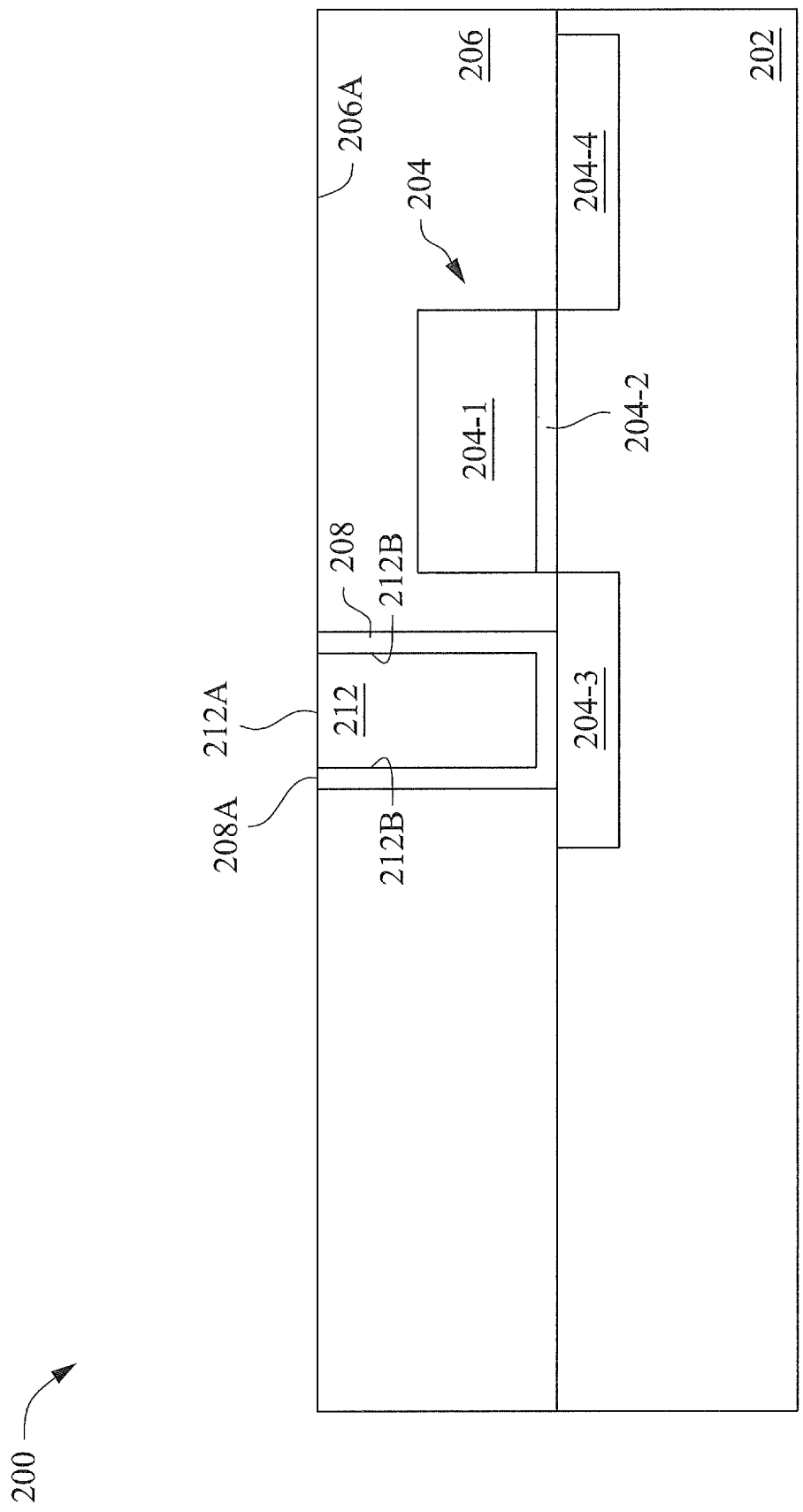

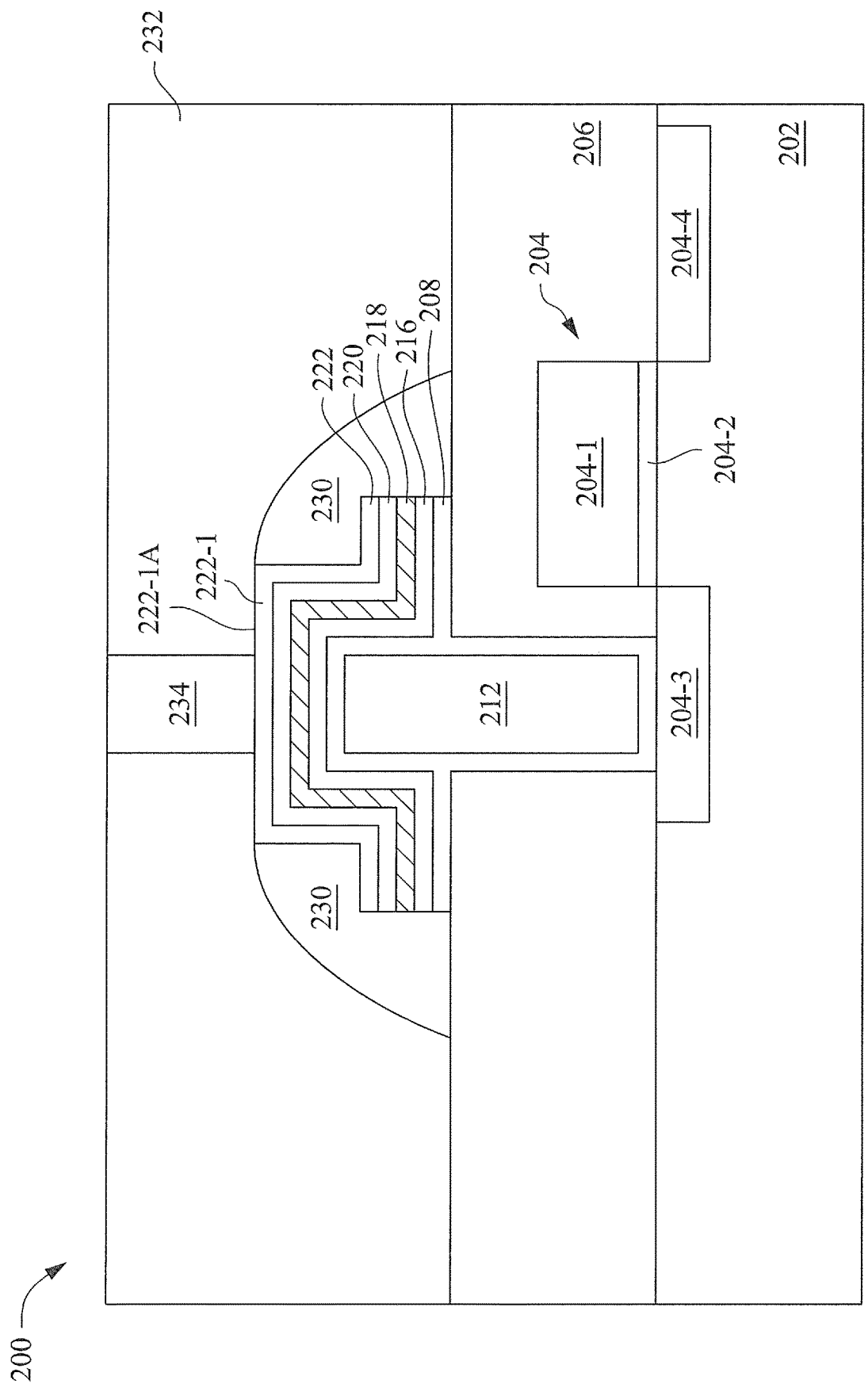

RESISTIVE RANDOM ACCESS MEMORY DEVICE

CROSS-REFERENCE TO RELATED APPLICATION

This application is a Continuation Application of U.S. patent application Ser. No. 16/834,232, filed Mar. 30, 2020, which is a Continuation Application of U.S. patent application Ser. No. 16/378,299, filed Apr. 8, 2019, which is a Continuation Application of U.S. patent application Ser. No. 15/965,881 filed Apr. 28, 2018, which claims priority to U.S. Provisional Patent Application No. 62/592,207, filed on Nov. 29, 2017, each of which are incorporated by reference herein in their entireties.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state and a low resistance state, have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

As integrated circuits (ICs), which include such RRAM devices, become more powerful, it is desirable to maximize the number of the RRAM devices in the IC accordingly. Generally, an RRAM device includes a top electrode (e.g., an anode) and a bottom electrode (e.g., a cathode) with a variable resistive material layer interposed therebetween. In particular, an active area of the variable resistive material layer typically extends in parallel with the top and bottom electrodes, respectively. Forming the RRAM device in such a stack configuration that each layer can only extend two-dimensionally may encounter a trade-off between maximizing the number of the RRAM devices in the IC and maintaining optimal performance of the RRAM device. For example, the number of the RRAM devices is typically proportional to a number of the active areas of the variable resistive material layers. As such, within a given area of the IC, when the number of the RRAM devices is increased, the active area of each of the RRAM device shrinks, which may disadvantageously impact respective performance of each of the RRAM devices due to weaker signal coupling between respective top and bottom electrodes.

Thus, existing RRAM devices and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 2A, 2B, 2C, 2D, 2E, 2F, 2G, 2H, 2I, 2J, 2K, 2L, 2M, 2N, 2O, and 2P illustrate cross-sectional views of an exemplary semiconductor device during various fabrication stages, made by the method of FIG. 1, in accordance with some embodiments.

DETAILED DESCRIPTION OF EXEMPLARY EMBODIMENTS

Figure 1A:
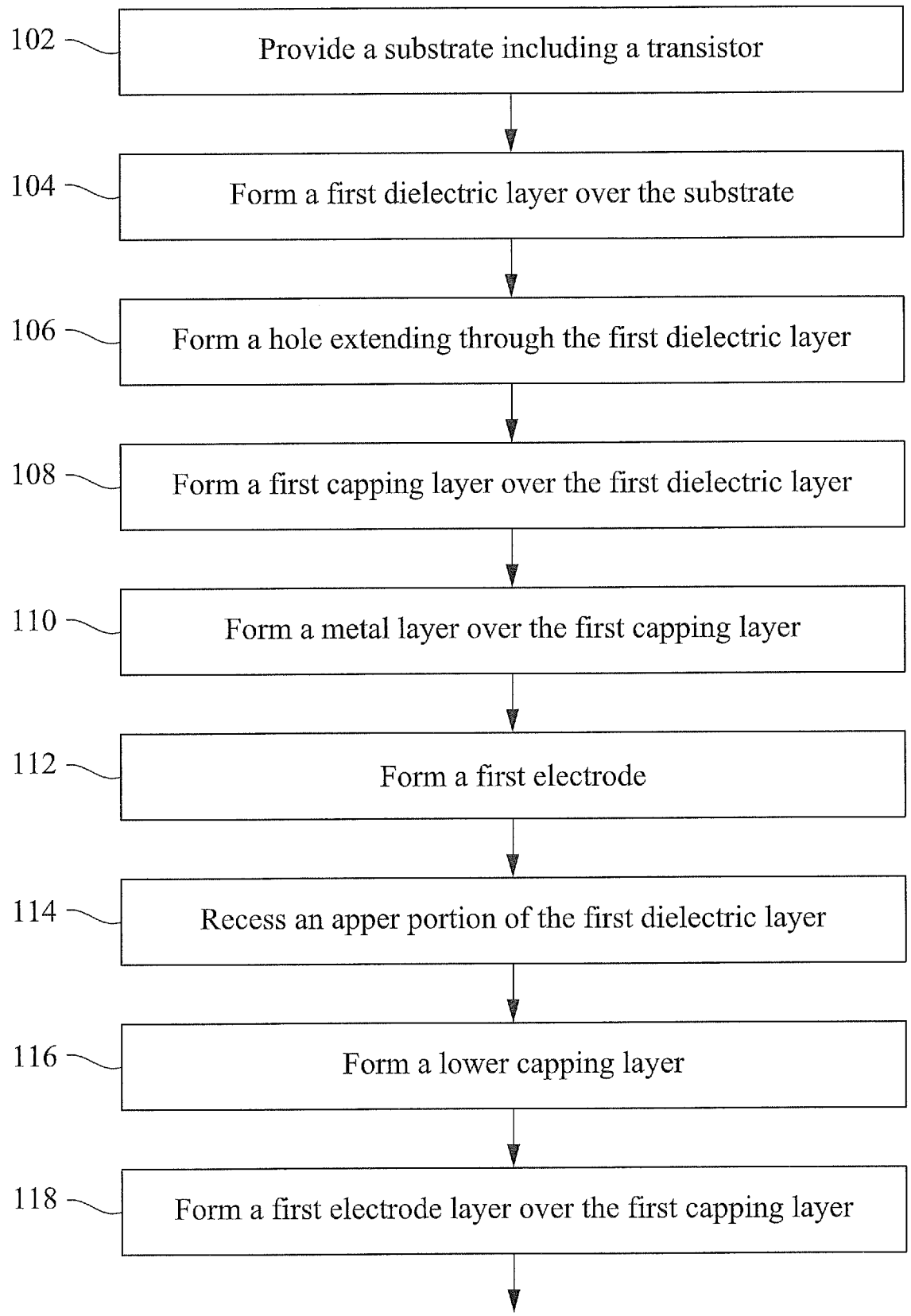
FIGS. 1A and 1B illustrate a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel RRAM device and methods to form the same. In some embodiments, the disclosed RRAM device includes an RRAM resistor including a reverse U-shaped variable resistive material layer that includes a first boundary (e.g., a concave lower boundary) coupled to a bottom electrode and a second boundary (e.g., a convex upper boundary) coupled to a top electrode, respectively. More specifically, the first boundary of the reverse U-shaped variable resistive material layer may surround at least an upper portion of the bottom electrode, while the second boundary of the reverse U-shaped variable resistive material layer may be coupled to a bottom boundary of the top electrode. Forming such a reverse U-shaped variable resistive material layer in the RRAM resistor may provide various advantages. For example, when compared to the aforementioned conventional RRAM device, within a given area, forming the variable resistive material layer in the reverse U-shaped profile may substantially increase an active area of the variable resistive material layer that can be coupled to the top and bottom electrodes. Alternatively stated, when making an IC to integrate plural disclosed RRAM devices, the above-mentioned trade-off between the performance and the number of RRAM devices that can be integrated may be advantageously eliminated.

Figure 1B:
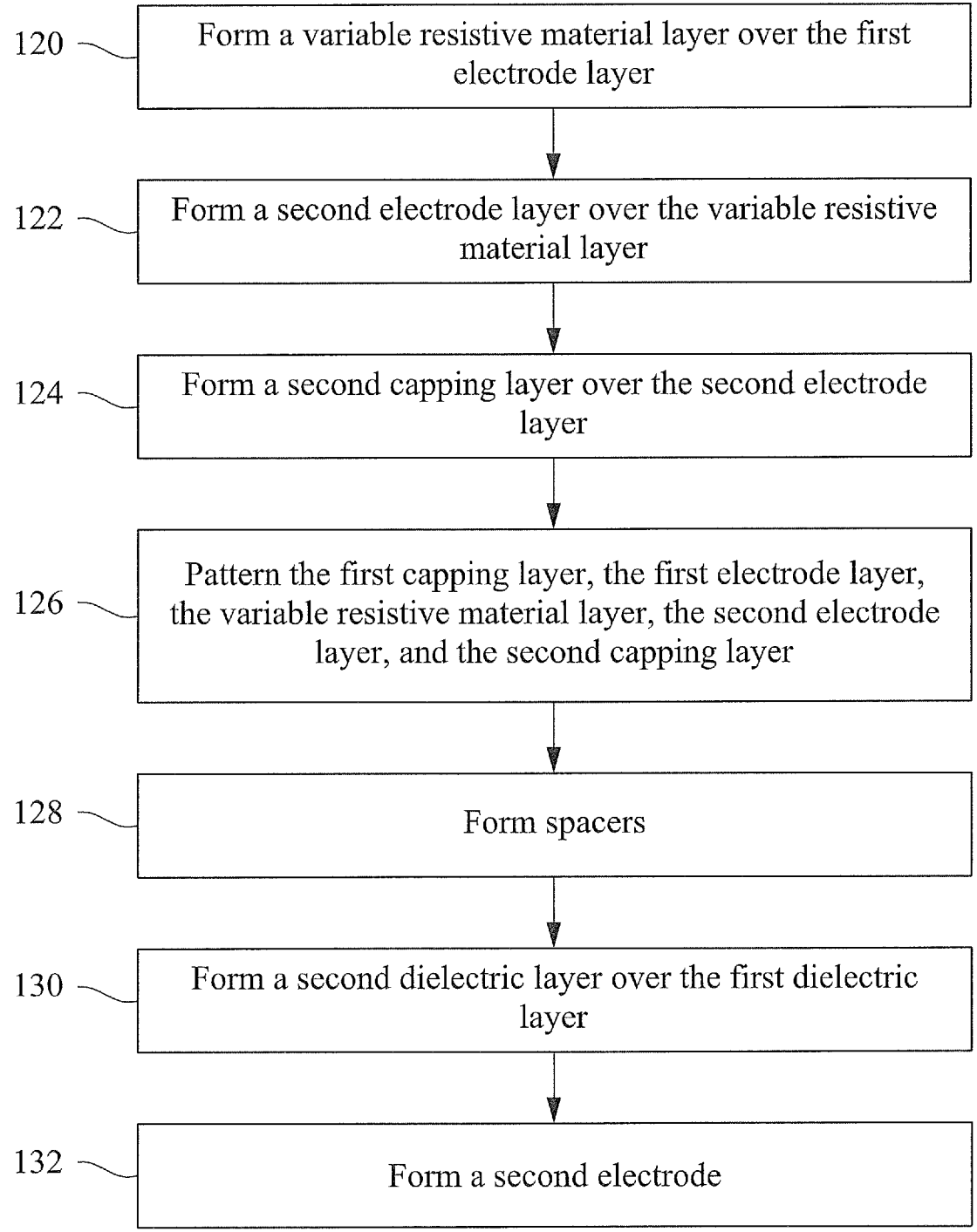

FIGS. 1A and 1B illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, an RRAM device. As employed by the present disclosure, the RRAM device refers to any device including a variable resistive material layer. It is noted that the method 100 of FIGS. 1A and 1B does not produce a completed RRAM device. A completed RRAM device may be fabricated using complementary metal-oxide-semiconductor (CMOS) technology processing. Accordingly, it is understood that additional operations may be provided before, during, and after the method 100 of FIGS. 1A and 1B, and that some other operations may only be briefly described herein. In some other embodiments, the method may be used to form any of a variety of nonvolatile memory (NVM) devices, such as ferroelectric random access memory (FRAM) devices, phase-change random access memory (PRAM) devices, resistive random access memory (RRAM) devices, etc., while remaining within the scope of the present disclosure.

Referring first to FIG. 1A, in some embodiments, the method 100 starts with operation 102 in which a substrate including a transistor is provided. The method 100 continues to operation 104 in which a first dielectric layer is formed over the substrate. In some embodiments, the first dielectric layer is formed over the transistor. In some embodiments, the first dielectric layer may be an inter-metal dielectric layer, which is formed over the substrate with one or more such inter-metal dielectric layers disposed therebetween, as will be discussed in further detail below. The method 100 continues to operation 106 in which a hole extending through the first dielectric layer is formed. In some embodiments, the hole may expose a portion of at least one conductive feature (e.g., a drain, a source, a gate, etc.) of the transistor. Alternatively stated, the hole may be in communication with the at least one conductive feature of the transistor. The method 100 continues to operation 108 in which a first capping layer is formed over the first dielectric layer. In some embodiments, the first capping layer lines the hole extending through the first dielectric layer, and extends along an upper boundary of the first dielectric layer. The method 100 continues to operation 110 in which a metal layer is formed over the first capping layer. In some embodiments, the metal layer overlays the upper boundary of the first capping layer and fills the hole.

Next, the method 100 continues to operation 112 in which a first electrode is formed. In some embodiments, the first electrode is formed of the metal layer that fills the hole, which will be discussed below. The method 100 continues to operation 114 in which an upper portion of the first dielectric layer is recessed. Alternatively stated, a new upper boundary of the first dielectric layer is formed, which exposes an upper portion of the first electrode and an upper portion of the first capping layer that extends along an upper sidewall of the first electrode. The method 100 continues to operation 116 in which a lower capping layer is formed. In some embodiments, such a lower capping layer, which may be formed of a substantially similar material as the first capping layer, may overlay the new upper boundary of the first dielectric layer and an exposed upper boundary of the first electrode. As such, in addition to overlaying the new upper boundary of the first dielectric layer, the first capping layer and the lower capping layer that are integrally formed as a single piece may line the first electrode, which will be discussed below. The method 100 continues to operation 118 in which a first electrode layer is formed over the first capping layer.

Referring then to FIG. 1B, the method 100 continues to operation 120 in which a variable resistive material layer is formed over the first electrode layer. The method 100 continues to operation 122 in which a second electrode layer is formed over the variable resistive material layer. The method 100 continues to operation 124 in which a second capping layer is formed over the second electrode layer. In some embodiments, the first capping layer, the first electrode layer, the variable resistive material layer, the second electrode layer, and the second capping layer are each substantially conformal and thin. As such, the first capping layer, the first electrode layer, the variable resistive material layer, the second electrode layer, and the second capping layer may each follow a profile of the exposed upper portion of the first electrode (i.e., each forming a reverse U-shaped profile), which will be discussed in further detail below. The method 100 continues to operation 126 in which the first capping layer, the first electrode layer, the variable resistive material layer, the second electrode layer, and the second capping layer are patterned. In some embodiment, after the patterning, the respective reverse U-shaped profiles of the first capping layer, the first electrode layer, the variable resistive material layer, the second electrode layer, and the second capping layer may remain unchanged. The method 100 continues to operation 128 in which spacers are formed. In some embodiments, the spacers are disposed at respective sides of the patterned first electrode layer, variable resistive material layer, second electrode layer, and second capping layer. The method 100 continues to operation 130 in which a second dielectric layer is formed over the first dielectric layer. In some embodiments, the first and second dielectric layers may be formed of a substantially identical material, which causes the first and second dielectric layers to be referred to as a single tier. The method 100 continues to operation 132 in which a second electrode is formed. In some embodiments, the second electrode is formed to extend through the second dielectric layer and couple the variable resistive material layer through the second capping and electrode layers.

Figure 2A:
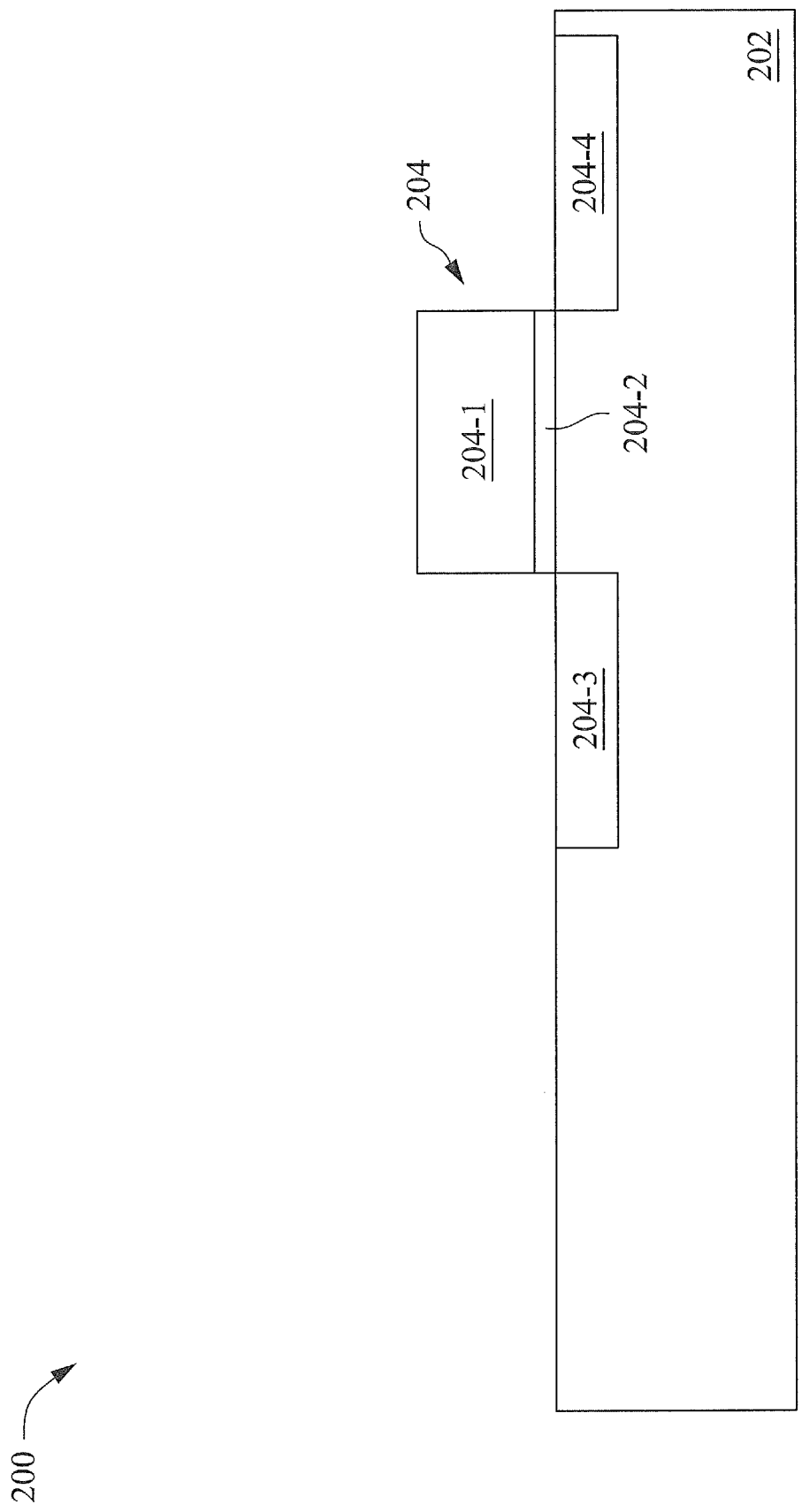

In some embodiments, operations of the method 100 may be associated with cross-sectional views of a semiconductor device 200 at various fabrication stages as shown in FIGS. 2A, 2B, 2C, 2D, 2E, 2F, 2G, 2H, 2I, 2J, 2K, 2L, 2M, 2N, 2O, and 2P, respectively. In some embodiments, the semiconductor device 200 may be an RRAM device. The RRAM device 200 may be included in a microprocessor, memory cell, and/or other integrated circuit (IC). Also, FIGS. 2A through 2P are simplified for a better understanding of the concepts of the present disclosure. For example, although the figures illustrate the RRAM device 200, it is understood the IC, in which the RRAM device 200 is formed, may include a number of other devices comprising resistors, capacitors, inductors, fuses, etc., which are not shown in FIGS. 2A through 2P, for purposes of clarity of illustration.

Corresponding to operation 102 of FIG. 1A, FIG. 2A is a cross-sectional view of the RRAM device 200 including a substrate 202 with a transistor 204, which is provided at one of the various stages of fabrication, according to some embodiments. Although the RRAM device 200 in the illustrated embodiment of FIG. 2A includes only one transistor 204, it is understood that the illustrated embodiment of FIG. 2A and the following figures are merely provided for illustration purposes. Thus, the RRAM device 200 may include any desired number of transistors while remaining within the scope of the present disclosure.

In some embodiments, the substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the transistor 204 includes a gate electrode 204-1, a gate dielectric layer 204-2, and source/drain features 204-3 and 204-4. The source/drain features 204-3 and 204-4 may be formed using doping processes such as ion implantation. The gate dielectric layer 204-2 may include a dielectric material such as, silicon oxide, silicon nitride, silicon oxinitride, dielectric with a high dielectric constant (high-k), and/or combinations thereof, which may be formed using deposition processes such as atomic layer deposition (ALD). The gate electrode 204-1 may include a conductive material, such as polysilicon or a metal, which may be formed using deposition processes such as chemical vapor deposition (CVD). As will be discussed in further detail below, the transistor 204 may serve as an access transistor of the RRAM device 200, which controls an access to a data storage component (e.g., an RRAM resistor) of the RRAM device 200 during read/write operations.

Figure 2B:
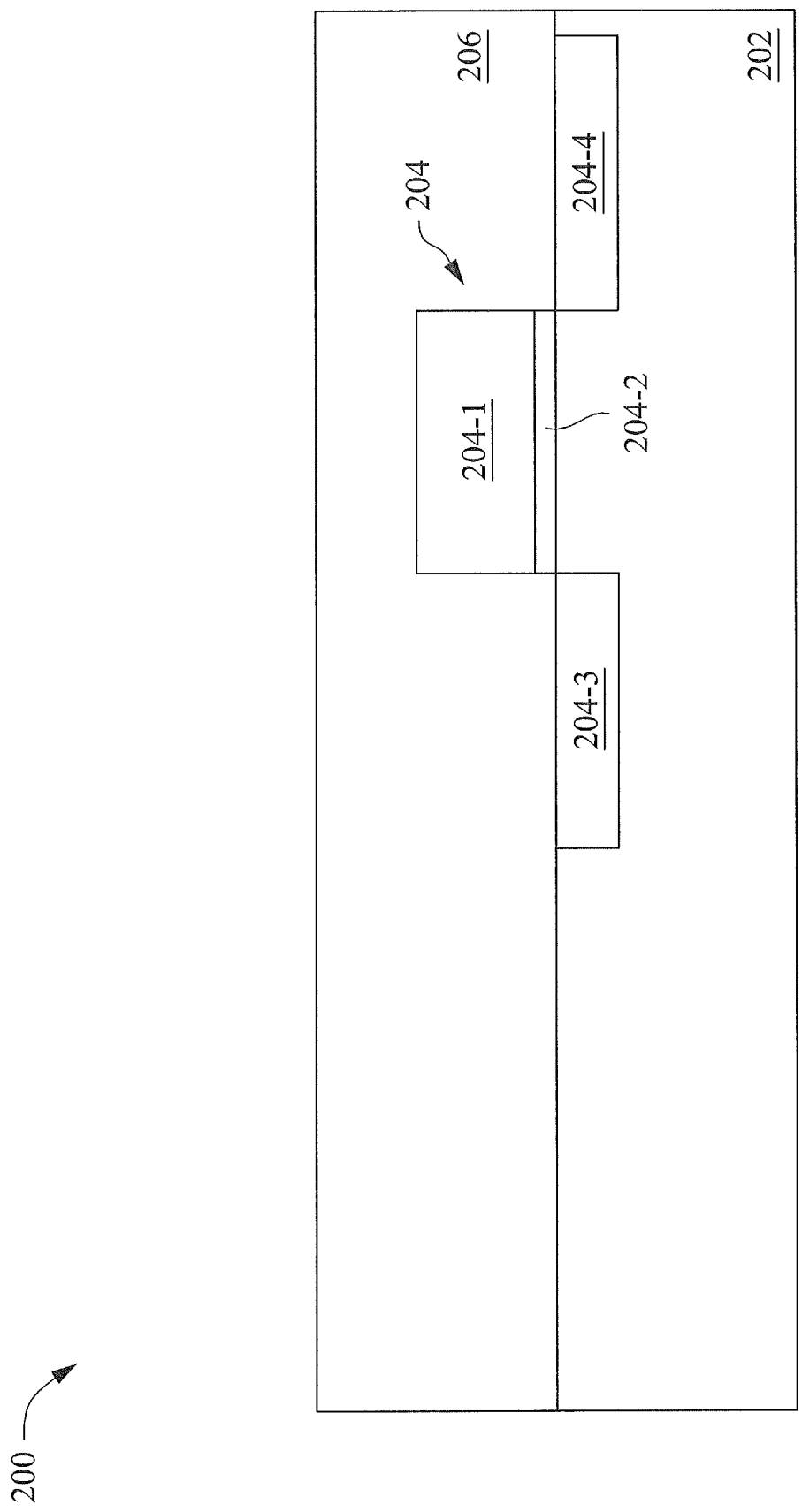

Corresponding to operation 104 of FIG. 1A, FIG. 2B is a cross-sectional view of the RRAM device 200 including a first dielectric layer 206, which is formed at one of the various stages of fabrication, according to some embodiments. As shown, the first dielectric layer 206 is formed over the transistor 204, and a major surface of the substrate 202. As mentioned above, the first dielectric layer may be part of an inter-metal dielectric (IMD) layer. Although in the illustrated embodiment of FIG. 2B (and the following figures), the first dielectric layer 206 directly overlays the substrate 202 and the transistor 204, it is noted that between the first dielectric layer 206 and the substrate 202, there may be one or more such IMD layers while remaining within the scope of the present disclosure. Alternatively stated, the first dielectric layer 206 may be formed during a back-end-of-line (BEOL) process. For purposes of clarity, such one or more IMD layers are not shown in the figures of the present disclosure.

In some embodiments, the first dielectric layer 206 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Figure 2C:
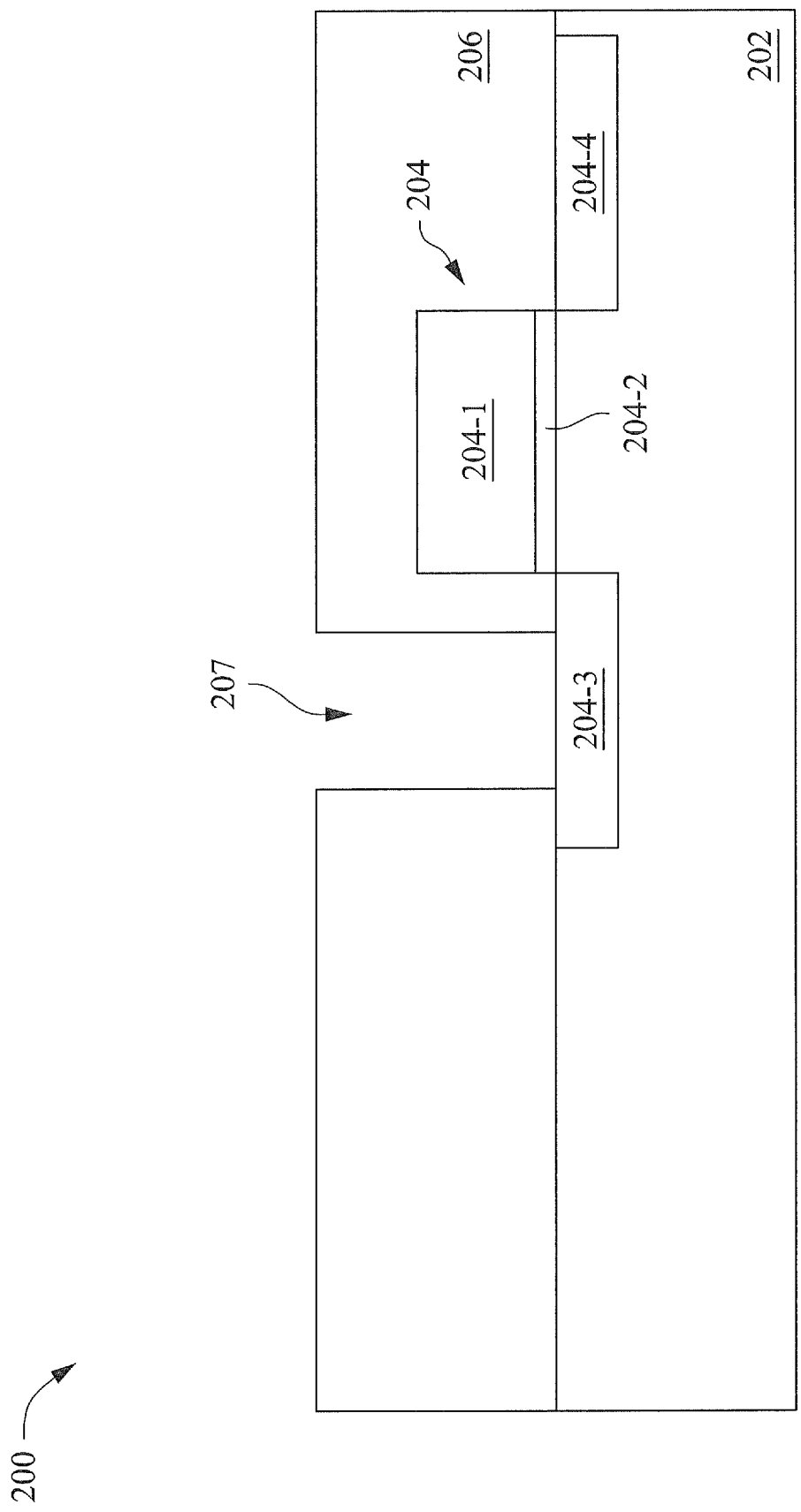

Corresponding to operation 106 of FIG. 1A, FIG. 2C is a cross-sectional view of the RRAM device 200 including a hole 207 extending through the first dielectric layer 206, which is formed at one of the various stages of fabrication, according to some embodiments. As shown, the hole 207 exposes the source/drain feature 204-3 (i.e., the hole 207 is in communication with the source/drain feature 204-3), which allows a later formed RRAM resistor to be coupled to the transistor 204 through the source/drain feature 204-3. As mentioned above, one or more IMD layers (not shown) may be formed between the first dielectric layer 206 and the substrate 202 so that the hole 207 may be indirectly in communication with the source/drain feature 204-3 through respective conductive features disposed in the one or more IMD layers.

In some embodiments, the hole 207 may be formed by performing at least some of the following processes: forming an optional anti-reflective coating (ARC) layer over the first dielectric layer 206; forming a patternable layer (e.g., a photoresist layer) with an opening that is aligned with an intended area to form the hole 207; while using the patternable layer as a mask, performing one or more dry etching processes to etch a portion of the first dielectric layer 206 that is not covered by the patternable layer; and removing the patternable layer.

Figure 2D:
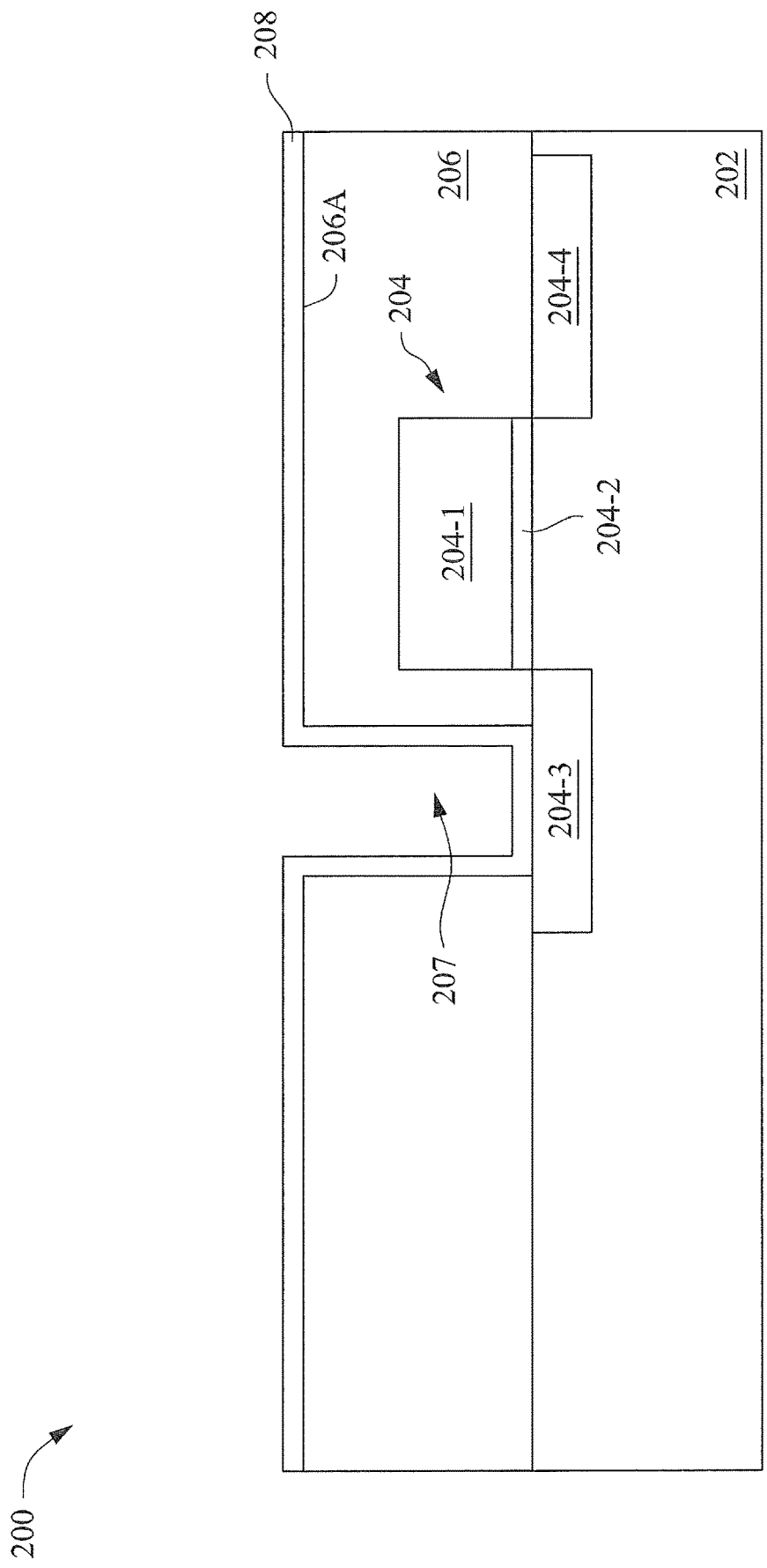

Corresponding to operation 108 of FIG. 1A, FIG. 2D is a cross-sectional view of the RRAM device 200 including a first capping layer 208, which is formed at one of the various stages of fabrication, according to some embodiments. As shown, the first capping layer 208 overlays a top boundary 206A of the first dielectric layer 206 and lines the hole 207, i.e., the first capping layer 208 overlaying a bottom boundary and sidewalls of the hole 207.

In some embodiments, the first capping layer 208 may be formed from materials such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the first capping layer 208 is shown as a single layer in the illustrated embodiment of FIG. 2D (and the following figures), it is noted that the first capping layer 208 may include plural layers formed as a stack, wherein each of the plural layers is formed of one of the above-described materials, e.g., TaN, TiN, etc. In some embodiments, the first capping layer 208 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the first dielectric layer 206.

Figure 2E:
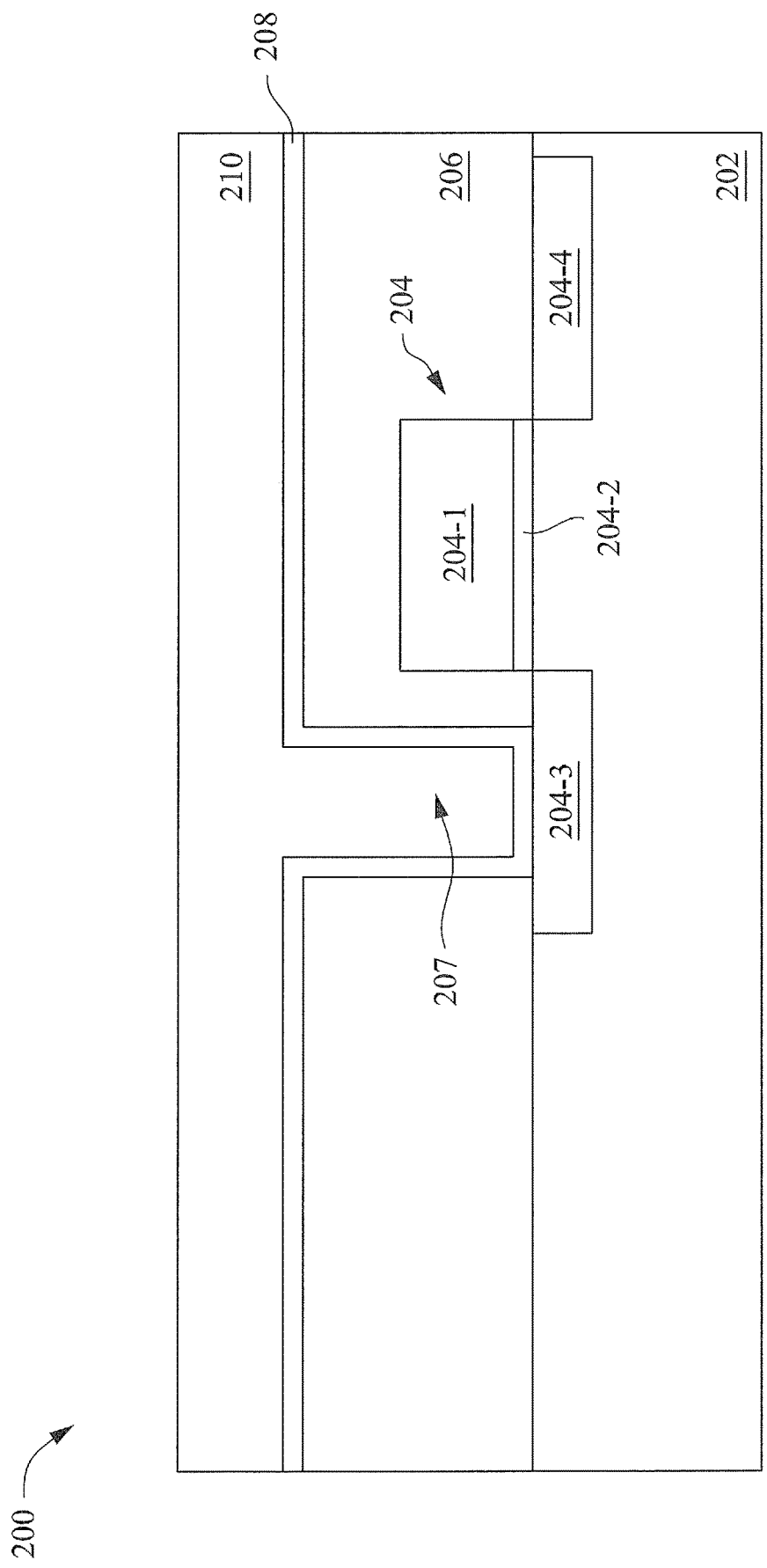

Corresponding to operation 110 of FIG. 1A, FIG. 2E is a cross-sectional view of the RRAM device 200 including a metal layer 210, which is formed at one of the various stages of fabrication, according to some embodiments. As shown, the metal layer 210 is formed to overlay the first capping layer 208, and accordingly fill the hole 207.

In some embodiments, the metal layer 210 may include a conductive material such as, for example, copper (Cu), aluminum (Al), tungsten (W), etc. In some embodiments, the metal layer 210 may be formed by using chemical vapor deposition (CVD), physical vapor deposition (PVD), spin-on coating, and/or other suitable techniques to deposit the above-described conductive material over the first capping layer 208.

Corresponding to operation 112 of FIG. 1A, FIG. 2F is a cross-sectional view of the RRAM device 200 including a first electrode 212, which is formed at one of the various stages of fabrication, according to some embodiments. In some embodiments, the first electrode 212 is formed by performing a polishing process (e.g., a chemical-mechanical polishing (CMP) process) on the metal layer 210 (FIG. 2E)

until the upper boundary 206A of the first dielectric layer 206 is re-exposed. Thus, it is understood that while performing such a polishing process, a portion of the first capping layer 208 that overlays the upper boundary 206A is removed. As such, an upper boundary 212A of the first electrode 212 is exposed, and further, an upper boundary 208A of a portion of the first capping layer 208 that extends along a sidewall 212B of the first electrode 212 is also exposed.

Figure 2G:
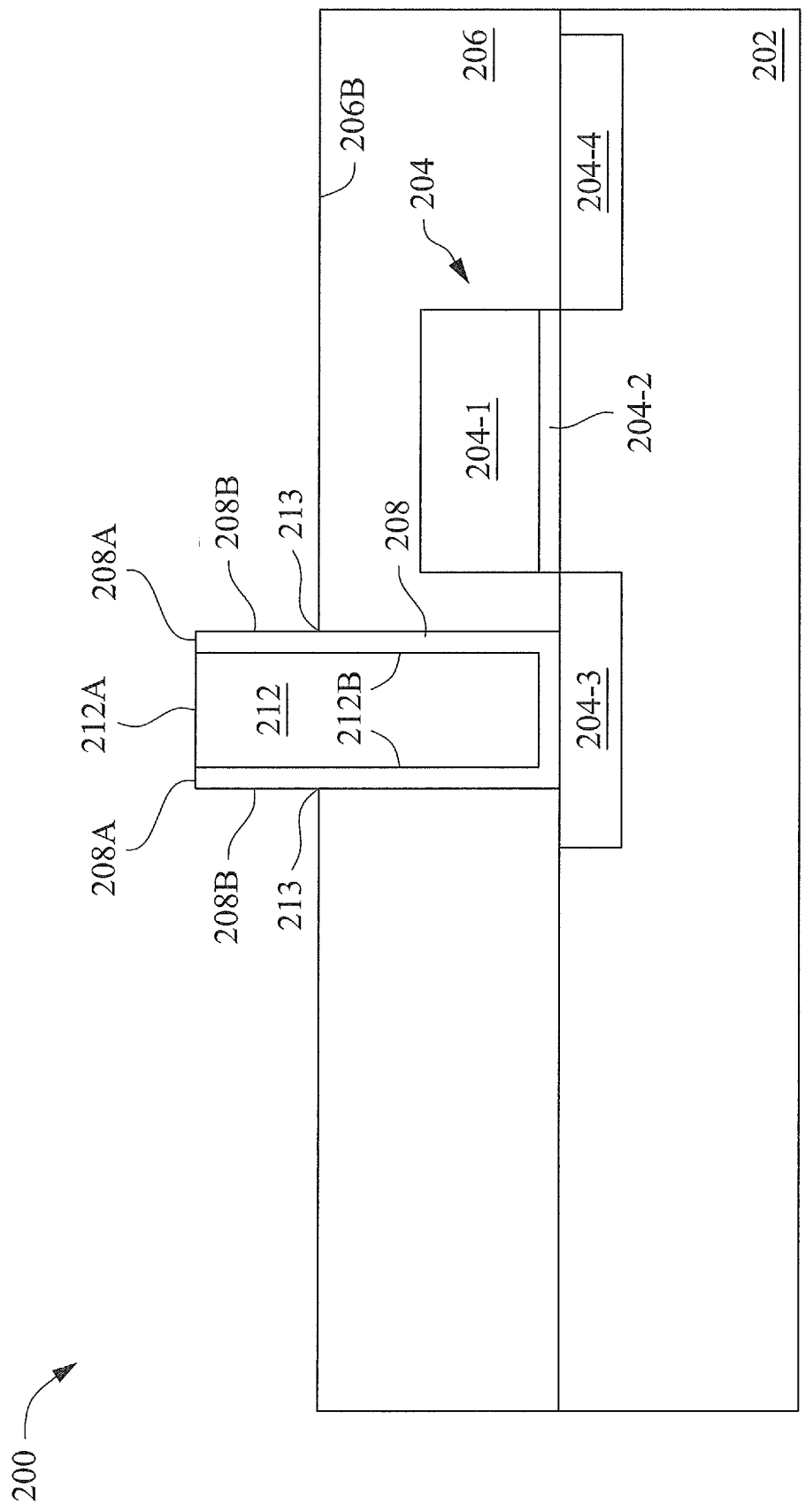

Corresponding to operation 114 of FIG. 1A, FIG. 2G is a cross-sectional view of the RRAM device 200 in which an upper portion of the first dielectric layer 206 is recessed at one of the various stages of fabrication, according to some embodiments. After the upper portion of the first dielectric layer 206 is recessed, as shown, a new upper boundary 206B of the first dielectric layer 206 is exposed, and further, a sidewall 208B of the portion of the first capping layer 208 that extends along the sidewall 212B of the first electrode 212 is also exposed. Alternatively stated, the first electrode 212 has an upper portion protruding from the new upper boundary 206B and a lower potion still embedded in the first dielectric layer 206. Moreover, in some embodiments, a corner (i.e., an L-shaped profile) 213 is formed at an intersection of the sidewall 208B and the (new) upper boundary 206B, and moreover, the upper boundaries 212A/ 208A and the sidewalls 208B may cooperatively form a reverse U-shaped profile.

In some embodiments, the recession of the upper portion of the first dielectric layer 206 may be formed by performing at least some of the following processes: forming an optional anti-reflective coating (ARC) layer over the first dielectric layer 206; forming a patternable layer (e.g., a photoresist layer) that covers the first electrode 212 (and the portion of the first capping layer 208 that extends along a sidewall 212B of the first electrode 212); while using the patternable layer as a mask, performing one or more dry etching processes to etch the upper portion of the first dielectric layer 206 that is not covered by the patternable layer; and removing the patternable layer.

Figure 2H:
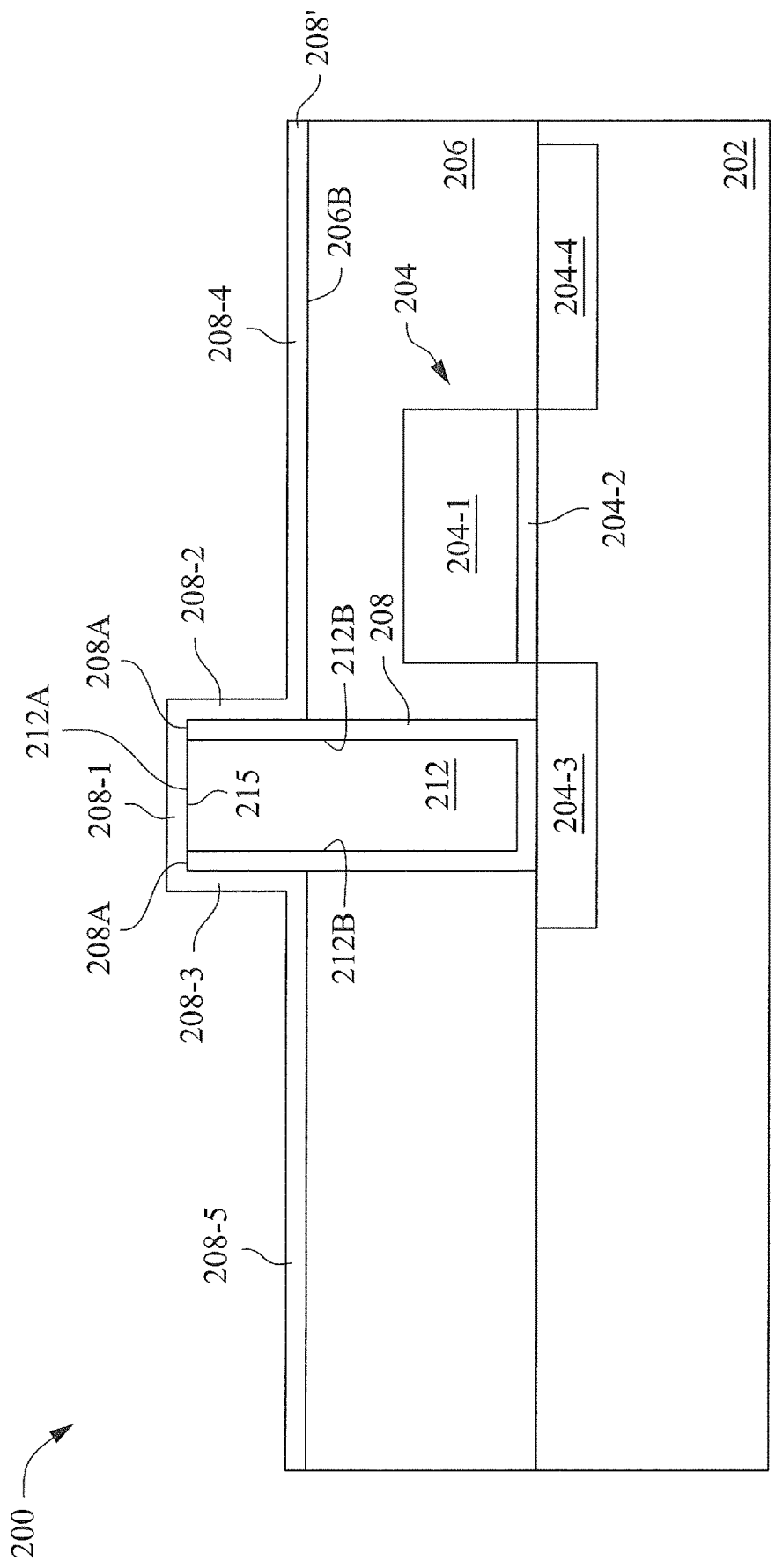

Corresponding to operation 116 of FIG. 1A, FIG. 2H is a cross-sectional view of the RRAM device 200 in which a lower capping layer 208' is formed at one of the various stages of fabrication, according to some embodiments. Since in some embodiments, the lower capping layer 208' may be formed as a substantially similar material as the first capping layer 208, the lower capping layer 208' and the first capping layer 208 may be integrally formed as a one-piece layer (i.e., the interface between such two layers is indistinguishable), which is herein referred to as the first capping layer 208 in the following discussions.

In some embodiments, the lower capping layer 208' is substantially conformal and thin (e.g., about 100~300 A in thickness) so that at least a portion of the first capping layer 208 may also follow a reverse U-shaped profile 215, which is defined by the upper boundary 212A and an upper portion of the sidewall 212B. As such, in some embodiments, the first capping layer 208 includes at least a horizontally extending (lateral) portion 208-1 that extends along the upper boundary 212A of the first electrode 212, and two vertically extending (longitudinal) portions 208-2 and 208-3 that respectively extend along the sidewalls 212B of the first electrode 212, wherein the two vertically extending portions 208-2 and 208-3 are respectively coupled to two ends of the horizontally extending portion 208-1. Further, the first capping layer 208 includes two horizontally extending, or "leg" portions 208-4 and 208-5 that respectively extend along the upper boundary 206B of the first dielectric layer 206, wherein the leg portions 208-4 is coupled to the vertically extending portion 208-2 at one end of the vertically extending portion 208-2 that is opposite to the other end to which the horizontally extending portion 208-1 is coupled, and the leg portions 208-5 is coupled to the vertically extending portion 208-3 at one end of the vertically extending portion 208-3 that is opposite to the other end to which the horizontally extending portion 208-1 is coupled. It is noted that the term "vertically extending portion," as used herein, does not necessarily imply a surface of such a vertically extending portion and an intersecting surface form an absolute right angle. For example, each of the vertically extending portions 208-2 and 208-3 and the horizontally extending portion 208-1 may form an acute or obtuse angle while remaining within the scope of the present disclosure.

Figure 2I:
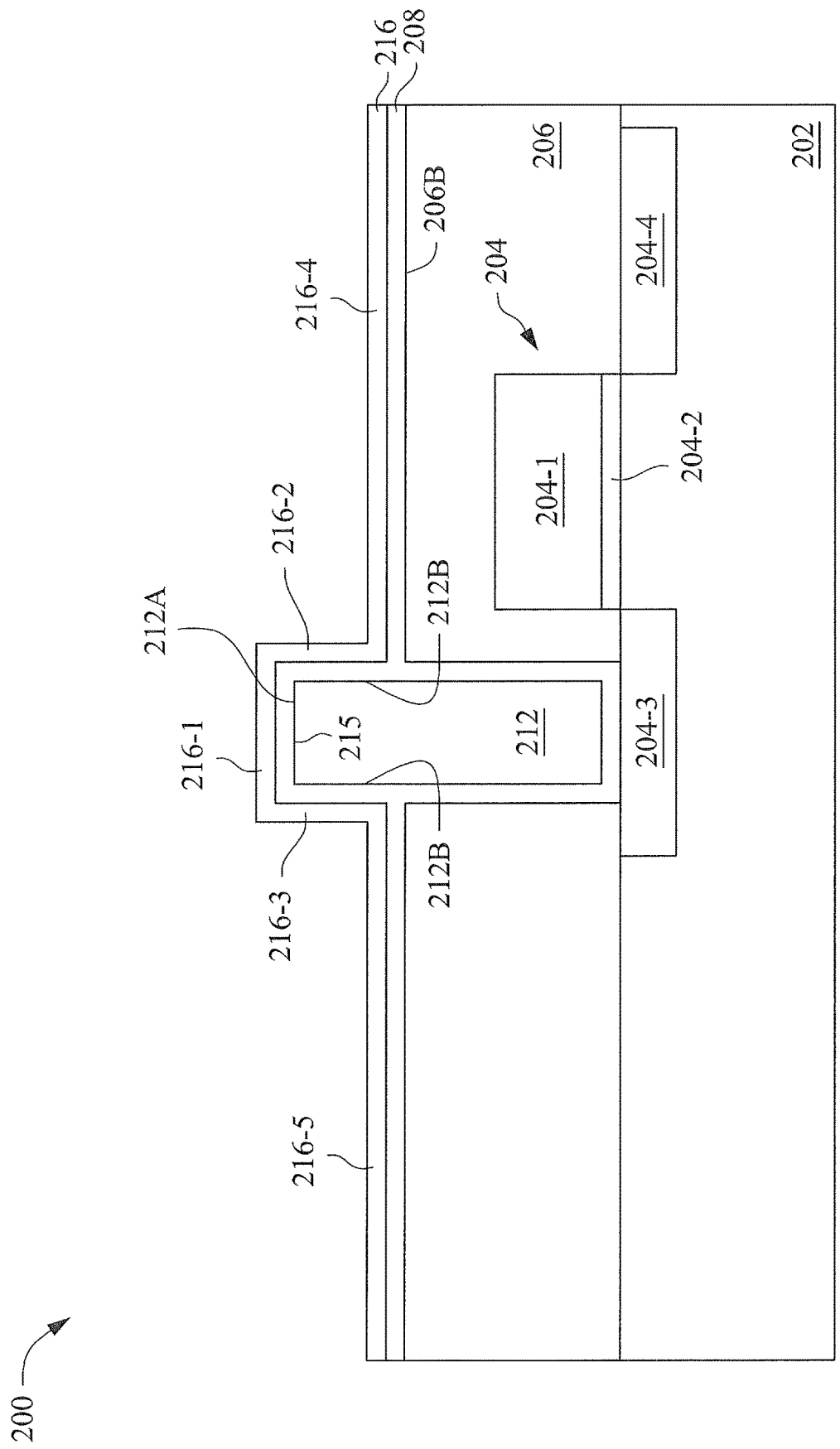

Corresponding to operation 118 of FIG. 1A, FIG. 2I is a cross-sectional view of the PRAM device 200 including a first electrode layer 216, which is formed at one of the various stages of fabrication, according to some embodiments. As shown, the first electrode layer 216 overlays the first capping layer 208. Similar as the first capping layer 208, the first electrode layer 216 is substantially conformal and thin (e.g., about 100~300 A in thickness) so that at least a portion of the first electrode layer 216 may also follow the reverse U-shaped profile 215. As such, in some embodiments, the first electrode layer 216 includes at least a horizontally extending portion 216-1 that extends along the upper boundary 212A of the first electrode 212, and two vertically extending portions 216-2 and 216-3 that respectively extend along the sidewalls 212B of the first electrode 212, wherein the two vertically extending portions 216-2 and 216-3 are respectively coupled to two ends of the horizontally extending portion 216-1. Further, the first electrode layer 216 includes two horizontally extending, or leg portions 216-4 and 216-5 that respectively extend along the upper boundary 206B of the first dielectric layer 206, wherein the leg portions 216-4 is coupled to the vertically extending portion 216-2 at one end of the vertically extending portion 216-2 that is opposite to the other end to which the horizontally extending portion 216-1 is coupled, and the leg portions 216-5 is coupled to the vertically extending portion 216-3 at one end of the vertically extending portion 216-3 that is opposite to the other end to which the horizontally extending portion 216-1 is coupled.

In some embodiments, the first electrode layer 216 may be formed from materials such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the first electrode layer 216 is shown as a single layer in the illustrated embodiment of FIG. 2I (and the following figures), it is noted that the first electrode layer 208 may include plural layers formed as a stack, wherein each of the plural layers is formed of one of the above-described materials, e.g., TaN, TiN, etc. In some embodiments, the first electrode layer 216 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the first capping layer 208.

Figure 2J:
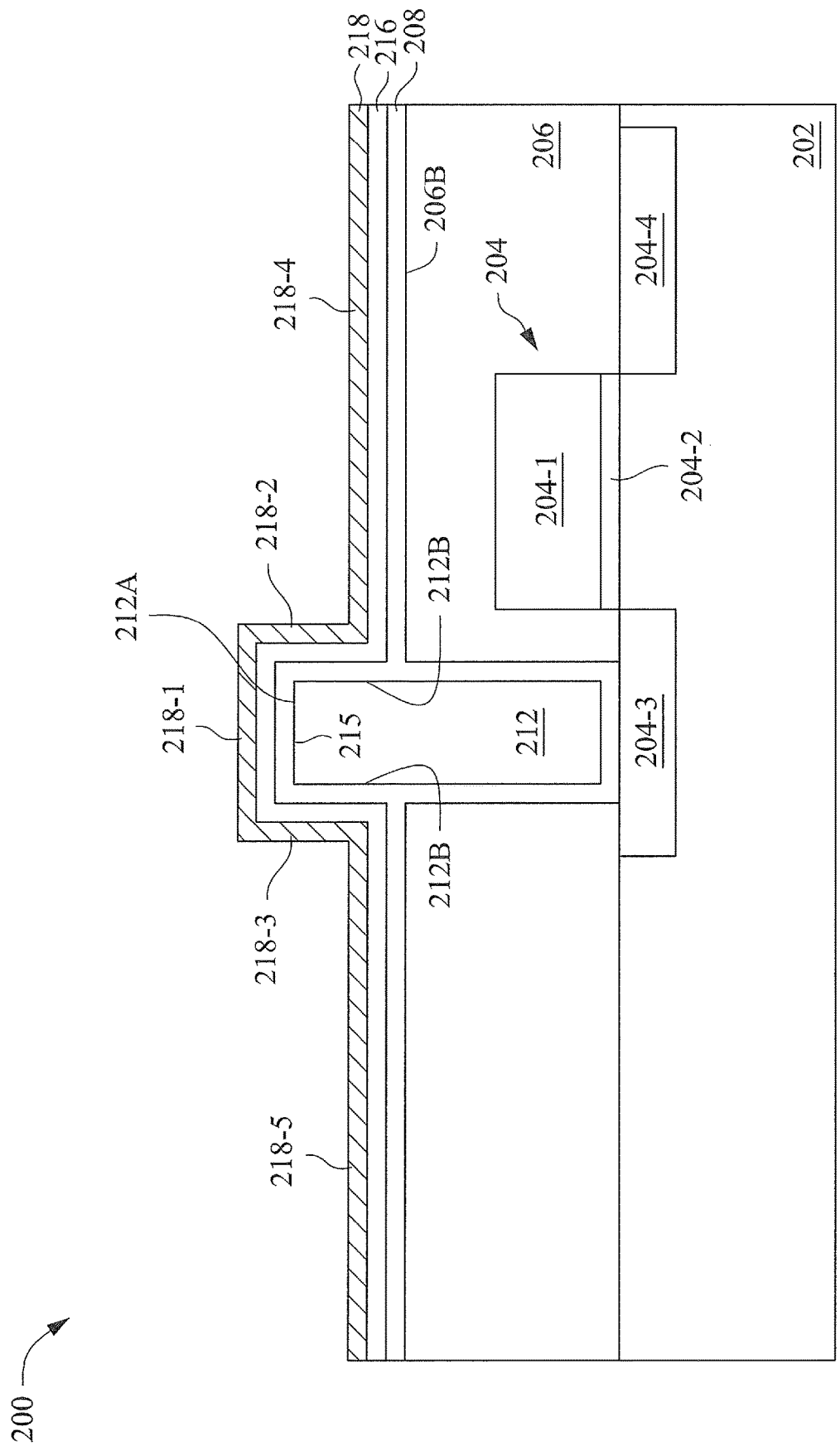

Corresponding to operation 120 of FIG. 1B, FIG. 2J is a cross-sectional view of the RRAM device 200 including a variable resistive material layer 218, which is formed at one of the various stages of fabrication, according to some embodiments. As shown, the variable resistive material layer 218 overlays the first electrode layer 206. Similar as the first capping layer 208 and first electrode layer 216, the variable resistive material layer 218 is substantially conformal and thin (e.g., about 10~100 A in thickness) so that at least a portion of the variable resistive material layer 218 may also follow the reverse U-shaped profile 215. As such, in some embodiments, the variable resistive material layer 218 includes at least a horizontally extending portion 218-1 that extends along the upper boundary 212A of the first electrode 212, and two vertically extending portions 218-2 and 218-3 that respectively extend along the sidewalls 212B of the first electrode 212, wherein the two vertically extending portions 218-2 and 218-3 are respectively coupled to two ends of the horizontally extending portion 218-1. Further, the variable resistive material layer 218 includes two horizontally extending, or leg portions 218-4 and 218-5 that respectively extend along the upper boundary 206B of the first dielectric layer 206, wherein the leg portions 218-4 is coupled to the vertically extending portion 218-2 at one end of the vertically extending portion 218-2 that is opposite to the other end to which the horizontally extending portion 218-1 is coupled, and the leg portions 218-5 is coupled to the vertically extending portion 218-3 at one end of the vertically extending portion 218-3 that is opposite to the other end to which the horizontally extending portion 218-1 is coupled.

In some embodiments, the variable resistive material layer 218 is a layer having a resistance conversion characteristic (e.g. variable resistance). In other words, the variable resistive material layer 218 includes material characterized to show reversible resistance variance in accordance with a polarity and/or an amplitude of an applied electrical pulse. The variable resistive material layer 218 includes a dielectric layer. The variable resistive material layer 218 may be changed into a conductor or an insulator based on polarity and/or magnitude of electrical signal.

In one embodiment, the variable resistive layer 218 may include a transition metal oxide. The transition metal oxide maybe denoted as $M_xO_y$ where M is a transition metal, O is oxygen, x is the transition metal composition, and y is the oxygen composition. In an embodiment, the variable resistive material layer 218 includes $ZrO_2$. Examples of other materials suitable for the variable resistive material layer 218 include: NiO, $TiO_2$, HfO, ZrO, ZnO, $WO_3$, CoO, $Nb_2O_5$, $Fe_2O_3$, CuO, $CrO_2$, $SrZrO_3$ (Nb-doped), and/or other materials known in the art. In another embodiment, the variable resistive layer 218 may include a colossal magnetoresistance (CMR)-based material such as, for example, $Pr_{0.7}Ca_{0.3}$, $MnO_3$, etc.

In yet another embodiment, the variable resistive layer 218 may include a polymer material such as, for example, polyvinylidene fluoride and poly[(vinylidenefluoride-co-trifluoroethylene] (P(VDF/TrFE)). In yet another embodiment, the variable resistive layer 218 may include a conductive-bridging random access memory (CBRAM) material such as, for example, Ag in GeSe. According to some embodiments, the variable resistive material layer 218 may include multiple layers having characteristics of a resistance conversion material. A set voltage and/or a reset voltage of the variable resistive material layer 218 may be determined by the variable resistive material layer 218's compositions (including the values of "x" and "y"), thickness, and/or other factors known in the art.

In some embodiments, the variable resistive material layer 218 may be formed by an atomic layer deposition (ALD) technique with a precursor containing a metal and oxygen. In some embodiments, other chemical vapor deposition (CVD) techniques may be used. In some embodiments, the variable resistive material layer 218 may be formed by a physical vapor deposition (PVD) technique, such as a sputtering process with a metallic target and with a gas supply of oxygen and optionally nitrogen to the PVD chamber. In some embodiments, the variable resistive material layer 218 may be formed by an electron-beam deposition technique.

Figure 2K:
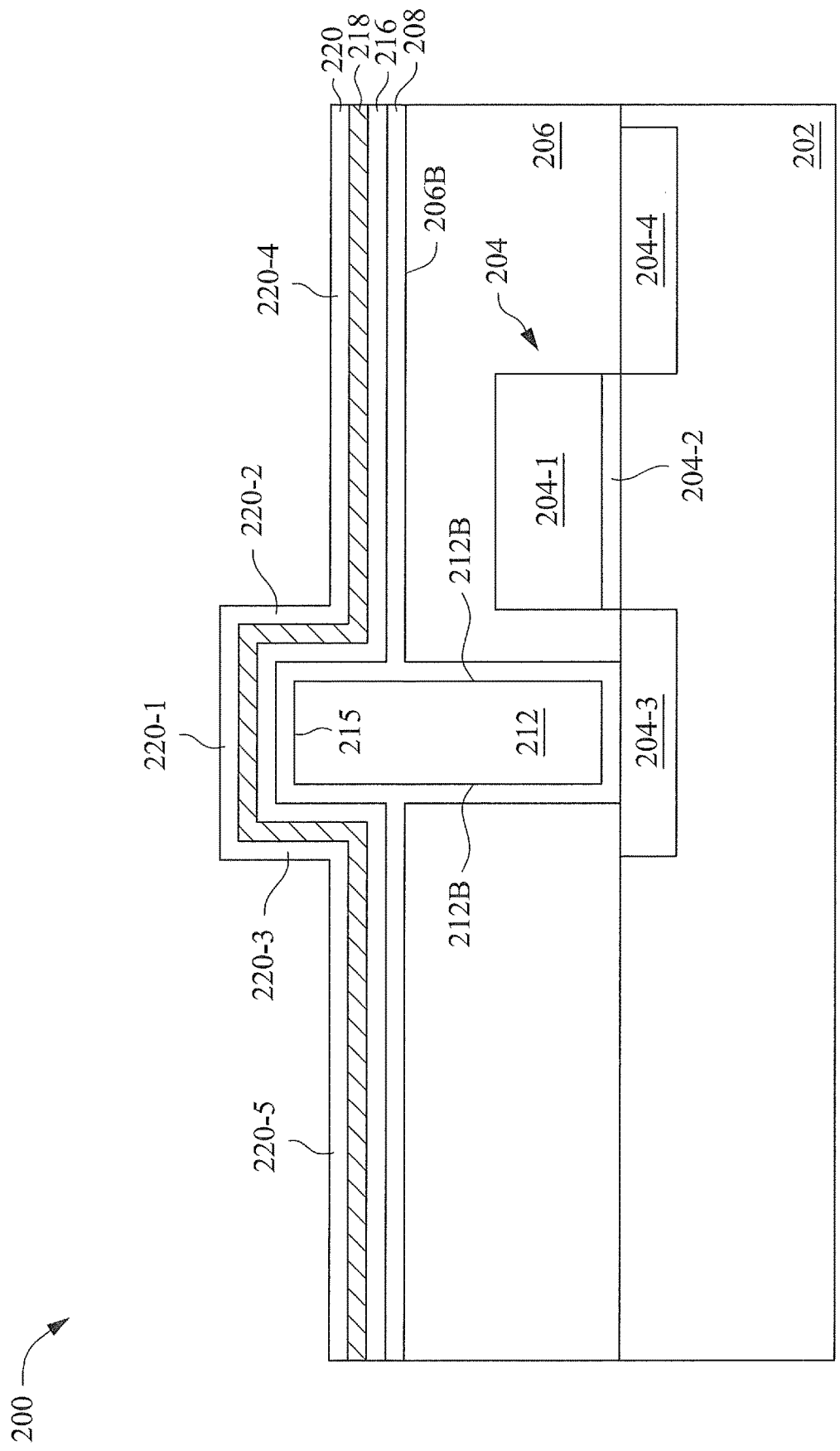

Corresponding to operation 122 of FIG. 1B, FIG. 2K is a cross-sectional view of the RRAM device 200 including a second electrode layer 220, which is formed at one of the various stages of fabrication, according to some embodiments. As shown, the second electrode layer 220 overlays the variable resistive material layer 218. Similarly, the second electrode layer 220 is substantially conformal and thin (e.g., about 100~300 A in thickness) so that at least a portion of the second electrode layer 220 may also follow the reverse U-shaped profile 215. As such, in some embodiments, the second electrode layer 220 includes at least a horizontally extending portion 220-1 that extends along the upper boundary 212A of the first electrode 212, and two vertically extending portions 220-2 and 220-3 that respectively extend along the sidewalls 212B of the first electrode 212, wherein the two vertically extending portions 220-2 and 220-3 are respectively coupled to two ends of the horizontally extending portion 220-1. Further, the second electrode layer 220 includes two horizontally extending, or leg portions 220-4 and 220-5 that respectively extend along the upper boundary 206B of the first dielectric layer 206, wherein the leg portions 220-4 is coupled to the vertically extending portion 220-2 at one end of the vertically extending portion 220-2 that is opposite to the other end to which the horizontally extending portion 220-1 is coupled, and the leg portions 220-5 is coupled to the vertically extending portion 220-3 at one end of the vertically extending portion 220-3 that is opposite to the other end to which the horizontally extending portion 220-1 is coupled.

In some embodiments, the second electrode layer 220 may be formed from materials such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the second electrode layer 220 is shown as a single layer in the illustrated embodiment of FIG. 2K (and the following figures), it is noted that the second electrode layer 220 may include plural layers formed as a stack, wherein each of the plural layers is formed of one of the above-described materials, e.g., TaN, TiN, etc. In some embodiments, the second electrode layer 220 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the variable resistive material layer 218.

Figure 2L:
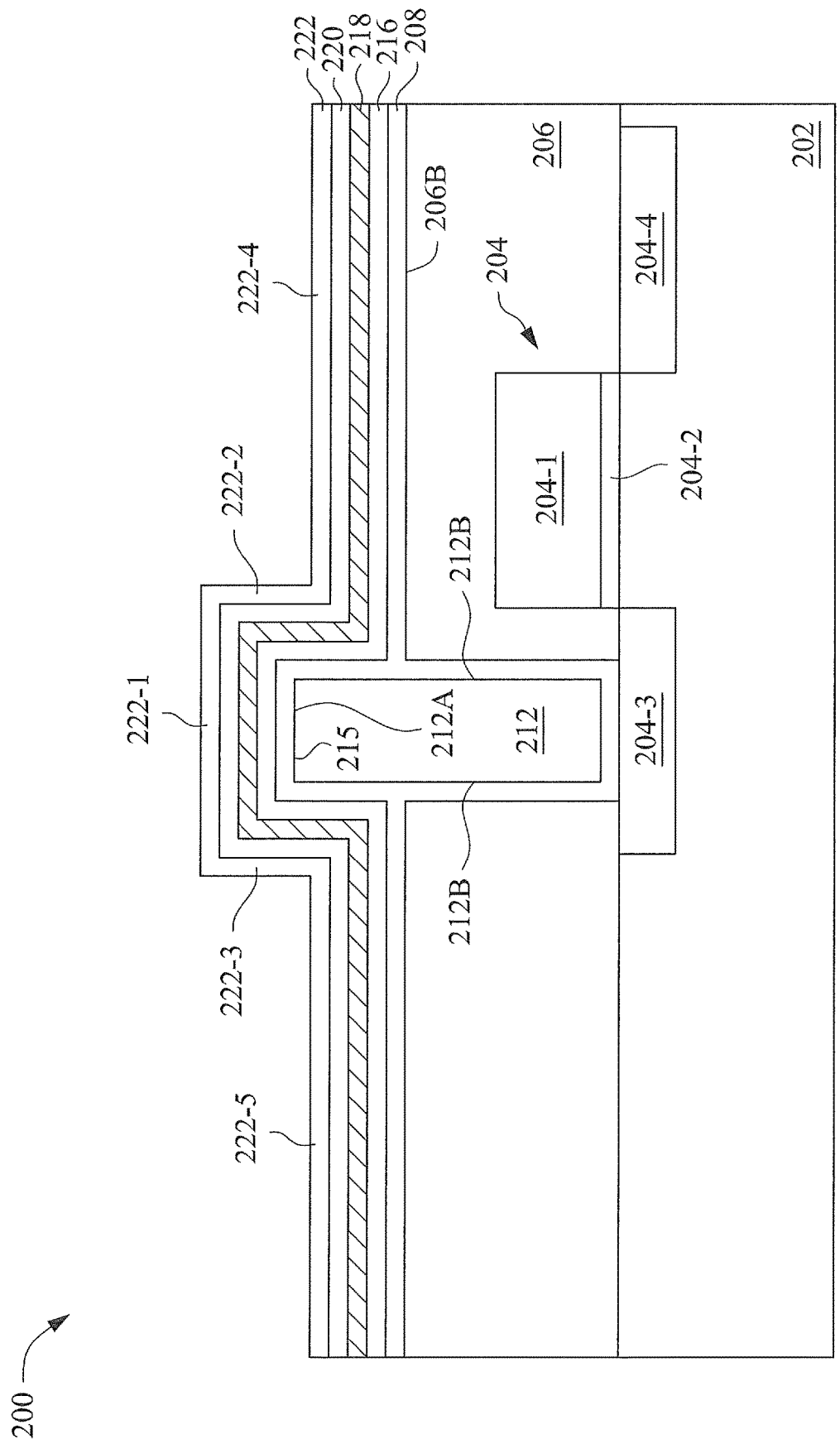

Corresponding to operation 124 of FIG. 1B, FIG. 2L is a cross-sectional view of the RRAM device 200 including a second capping layer 222, which is formed at one of the various stages of fabrication, according to some embodiments. As shown, the second capping layer 222 overlays the second electrode layer 220. Similarly, the second capping layer 222 is substantially conformal and thin (e.g., about 100~300 A in thickness) so that at least a portion of the second capping layer 222 may also follow the reverse U-shaped profile 215. As such, in some embodiments, the second capping layer 222 includes at least a horizontally extending portion 222-1 that extends along the upper boundary 212A of the first electrode 212, and two vertically extending portions 222-2 and 222-3 that respectively extend along the sidewalls 212B of the first electrode 212, wherein the two vertically extending portions 222-2 and 222-3 are respectively coupled to two ends of the horizontally extending portion 222-1. Further, the second capping layer 222 includes two horizontally extending, or leg portions 222-4 and 222-5 that respectively extend along the upper boundary 206B of the first dielectric layer 206, wherein the leg portions 222-4 is coupled to the vertically extending portion 222-2 at one end of the vertically extending portion 222-2 that is opposite to the other end to which the horizontally extending portion 222-1 is coupled, and the horizontally extending portions 222-5 is coupled to the vertically extending portion 222-3 at one end of the vertically extending portion 222-3 that is opposite to the other end to which the horizontally extending portion 222-1 is coupled.

In some embodiments, the second capping layer 222 may be formed from materials such as, for example, gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the second capping layer 222 is shown as a single layer in the illustrated embodiment of FIG. 2L (and the following figures), it is noted that the second capping layer 222 may include plural layers formed as a stack, wherein each of the plural layers is formed of one of the above-described materials, e.g., TaN, TiN, etc. In some embodiments, the second capping layer 222 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the second electrode layer 220.

Figure 2M:
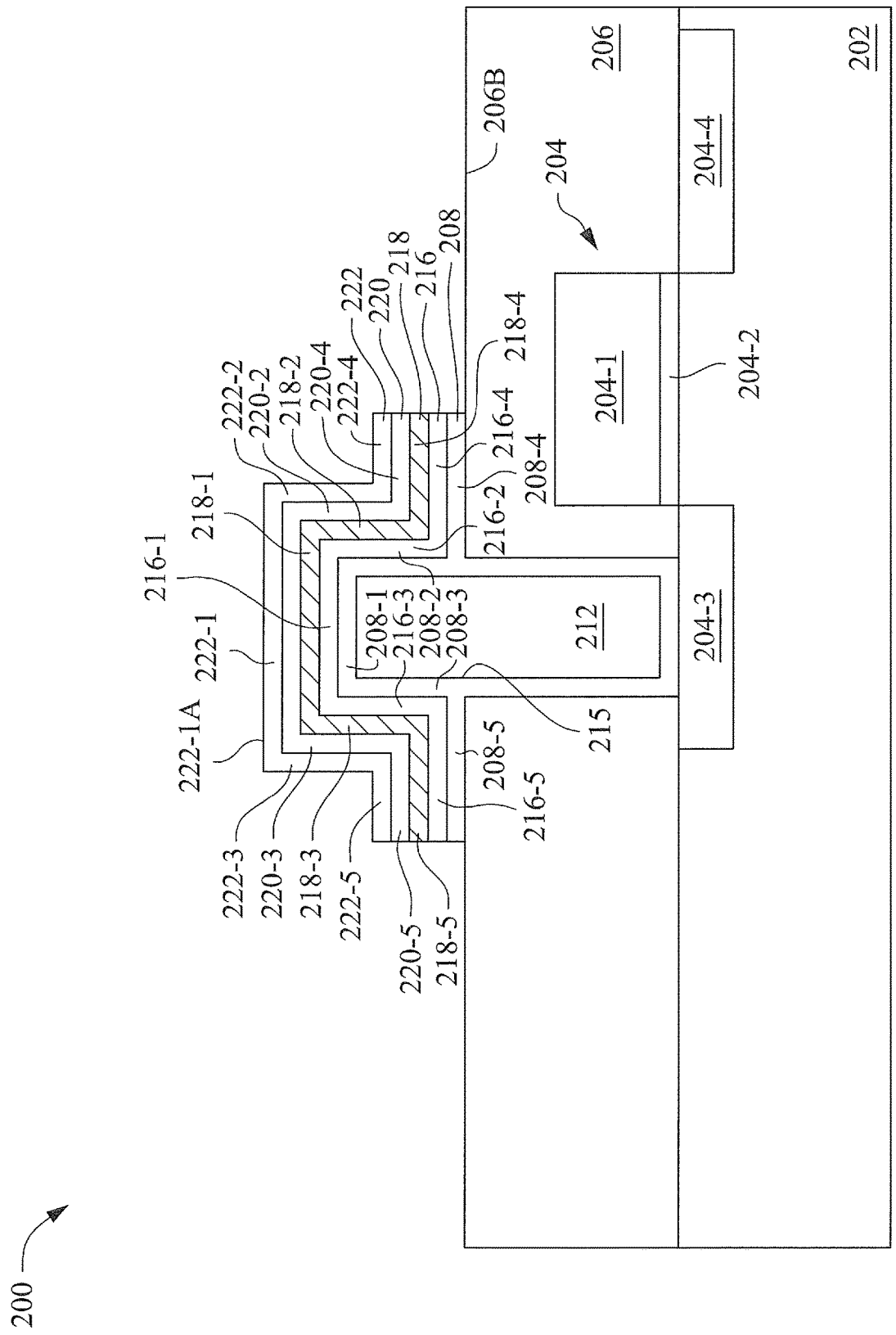

Corresponding to operation 126 of FIG. 1B, FIG. 2M is a cross-sectional view of the RRAM device 200 in which the first electrode layer 208, the first capping layer 216, the variable resistive material layer 218, the second electrode layer 220, and the second capping layer 222 are patterned at one of the various stages of fabrication, according to some embodiments. As shown, subsequently to such a patterning process, respective "leg" portions of the first electrode layer 208, the first capping layer 216, the variable resistive material layer 218, the second electrode layer 220, and the second capping layer 222 that extend along the upper boundary 206B are partially removed (e.g., etched). Moreover, such removed leg portions may be not directly coupled to respective vertically extending portions (e.g., 208-2/208-3, 216-2/216-3, 218-2/218-3, 220-2/220-3, and 222-2/222-3) so that the respective horizontally extending portions 208-1, 216-1, 218-1, 220-1, and 222-1 and vertically extending portions 208-2/208-3, 216-2/216-3, 218-2/218-3, 220-2/220-3, and 222-2/222-3 may remain intact. As such, the patterned first electrode layer 208, first capping layer 216, variable resistive material layer 218, second electrode layer 220, and second capping layer 222 may each still follow the reverse U-shaped profile 215.

In some embodiments, the patterned first electrode layer 208, first capping layer 216, variable resistive material layer 218, second electrode layer 220, and second capping layer 222 may be formed by performing at least some of the following processes: forming a patternable layer (e.g., a photoresist layer) covering the respective horizontally extending portions 208-1, 216-1, 218-1, 220-1, and 222-1, vertically extending portions 208-2/208-3, 216-2/216-3, 218-2/218-3, 220-2/220-3, and 222-2/222-3, and portions of the leg portions 208-4/208-5, 216-4/216-5, 218-4/218-5, 220-4/220-5, and 222-4/222-5; while using the patternable layer as a mask, performing one or more dry etching processes to etch portions of the leg portions 208-4/208-5, 216-4/216-5, 218-4/218-5, 220-4/220-5, and 222-4/222-5 that are not covered by the patternable layer; and removing the patternable layer.

Figure 2N:
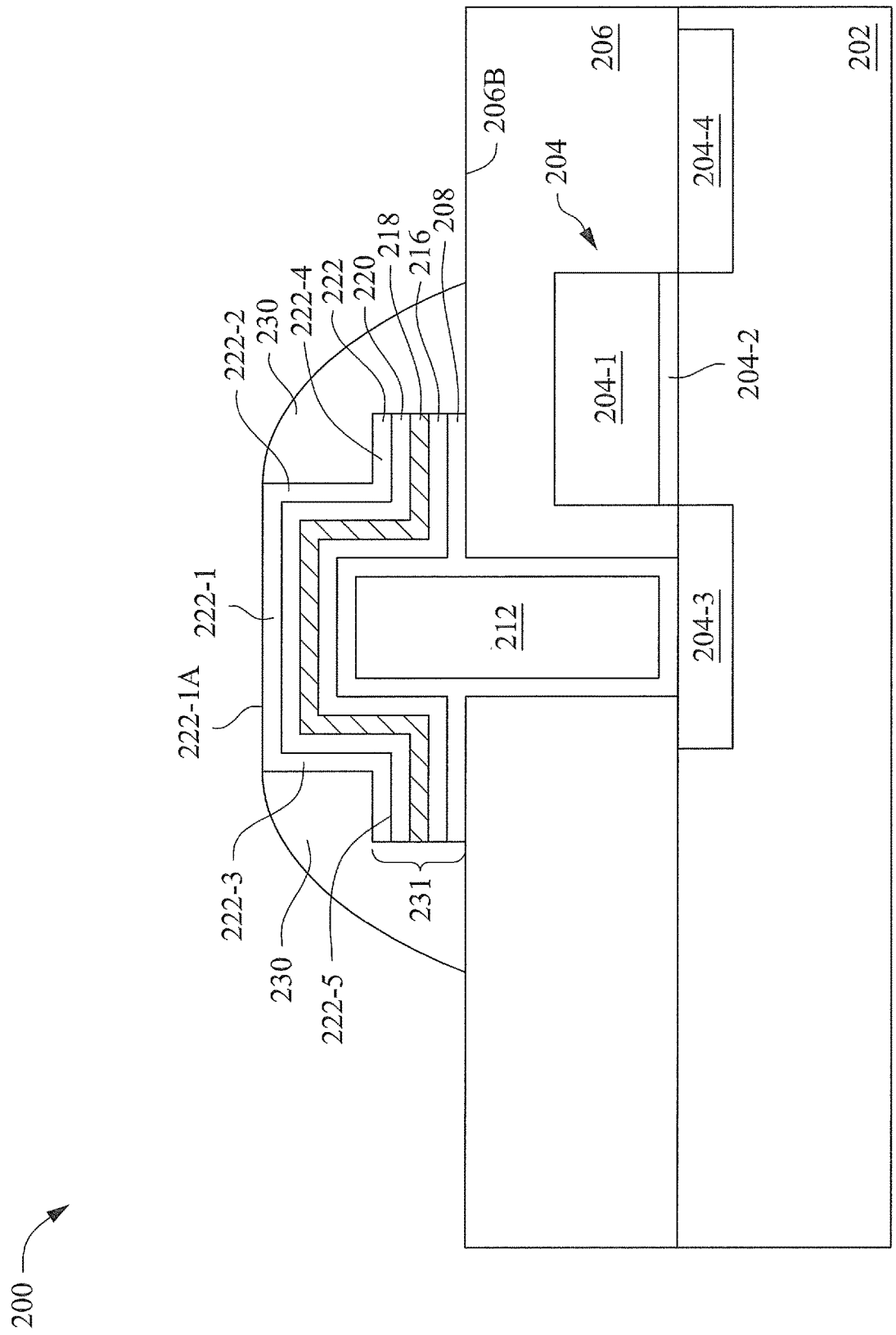

Corresponding to operation 128 of FIG. 1B, FIG. 2N is a cross-sectional view of the RRAM device 200 including spacers 230 which are formed at one of the various stages of fabrication, according to some embodiments. As shown, the spacers 230 are formed to respectively overlay sides of the patterned first electrode layer 208, first capping layer 216, variable resistive material layer 218, second electrode layer 220, and second capping layer 222 while at least partially exposing an upper boundary 222-1A of the horizontally extending portion 222-1 of the patterned second capping layer 222. More specifically, the spacers 230 may respectively overlay the vertically extending portions 222-2/222-3 and remaining leg portions 222-4/222-5, and sidewalls of the remaining leg portions 222-4/222-5 (and 208-4/208-5, 216-4/216-5, 218-4/218-5, 220-4/220-5), which are collectively referred to as sidewalls 231.

In some embodiments, the spacers 230 may be formed by performing at least some of the following processes: forming a dummy dielectric (e.g., silicon nitride (SiN), silicon carbide (SiC), or the like) layer over the first dielectric layer 206 and the patterned first electrode layer 208, first capping layer 216, variable resistive material layer 218, second electrode layer 220, and second capping layer 222; and performing one or more dry etching processes to etch the dummy dielectric layer until the upper boundary 222-1A of the horizontally extending portion 222-1 of the patterned second capping layer 222 and the upper boundary 206B of the first dielectric layer 206 are re-exposed.

Figure 2O:
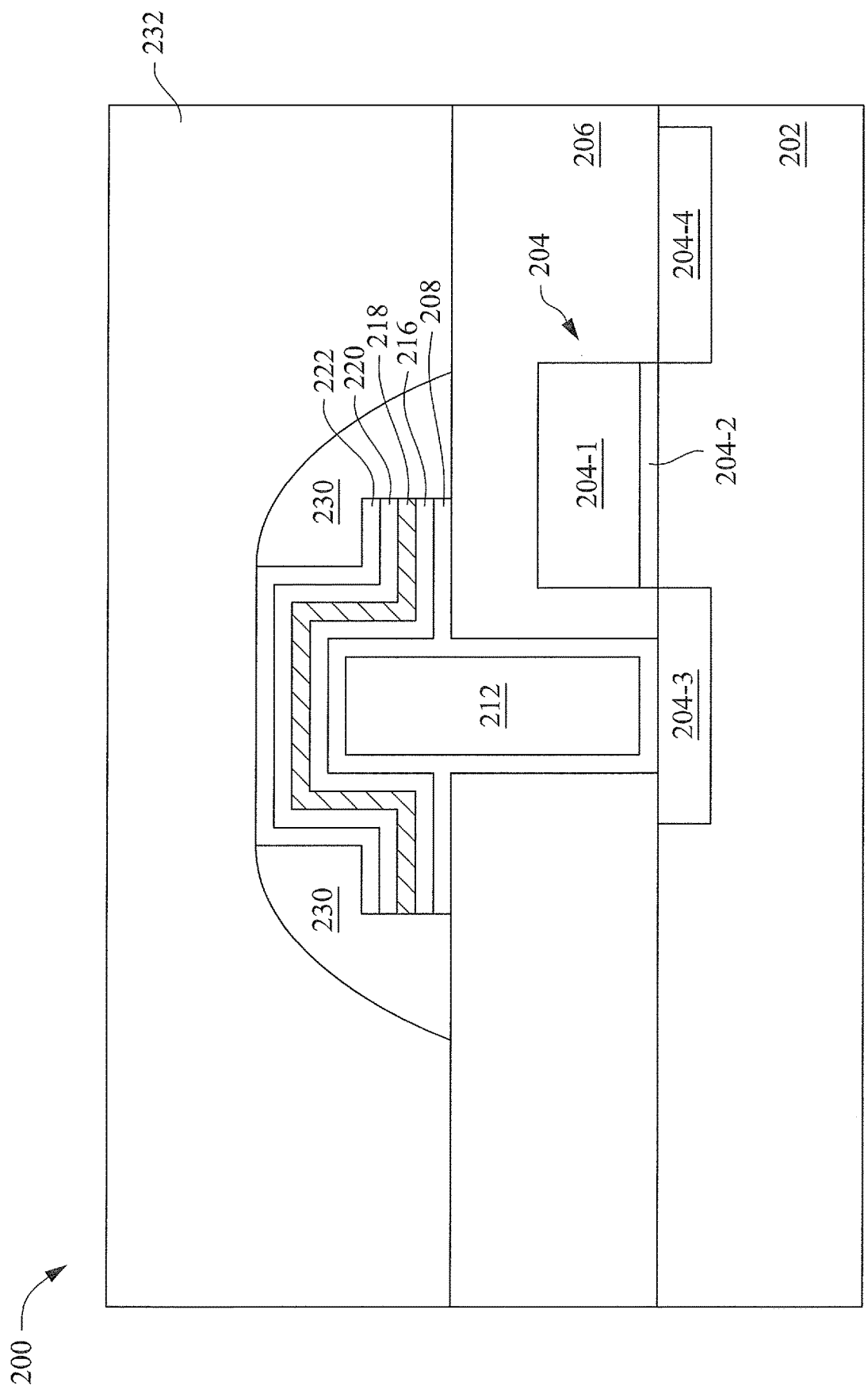

Corresponding to operation 130 of FIG. 1B, FIG. 2O is a cross-sectional view of the RRAM device 200 including a second dielectric layer 232, which is formed at one of the various stages of fabrication, according to some embodiments. As shown, the second dielectric layer 232 is formed to overlay the first dielectric layer 206, the patterned first electrode layer 208, first capping layer 216, variable resistive material layer 218, second electrode layer 220, and second capping layer 222, and the spacers 230. As mentioned above, the first dielectric layer 206 may be part of an inter-metal dielectric (IMD) layer, and in some embodiments, the second dielectric layer 232 is formed of a substantially identical material to the first dielectric layer 206. Thus, the first and second dielectric layer 206/232 may be referred to as a single tier, according to some embodiments.

In some embodiments, the second dielectric layer 232 is formed of a dielectric material. Such a dielectric material may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), strontium oxide (SrO), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

Corresponding to operation 132 of FIG. 1B, FIG. 2P is a cross-sectional view of the RRAM device 200 including a second electrode 234, which is formed at one of the various stages of fabrication, according to some embodiments. As shown, the second electrode 234 is coupled to at least a portion of the upper boundary 222-1A of the horizontally extending portion of the second capping layer 222.

In some embodiments, the second electrode 234 is formed by performing a series of processes substantially similar as the processes to form the first electrode 212. For example, the second electrode 231 may be formed by performing at least some of the following processes: forming a hole extending through the second dielectric layer 232 to expose at least a portion of the upper boundary 222-1A of the horizontally extending portion of the second capping layer 222; forming a metal (e.g., Cu) layer over the second dielectric layer 232 to refill the hole with the metal layer; and performing a CMP process to re-expose an upper boundary of the second dielectric layer 232.

In some embodiments, the first electrode 212, the first capping layer 208, the first electrode layer 216, the variable resistive material layer 218, the second electrode layer 220, the second capping layer 222, and the second electrode 234 may form an RRAM resistor, wherein the first electrode 212 serves as a bottom electrode and the second electrode 234 serves as a top electrode of the RRAM resistor, respectively. In some embodiments, such an RRAM resistor is coupled to transistor 204 so as to form a 1-transistor-1-resistor (1T1R) RRAM bit cell, wherein the RRAM resistor functions as the data storage component and the transistor 204 functions as the access transistor of the 1T1R RRAM bit cell. In some other embodiments, the RRAM resistor may be coupled to the transistor 204 through respective conductive structures disposed in the one or more WM layers (not shown) sandwiched between the substrate 202 and the first dielectric layer 206, as discussed above. It is noted the respective active area of the RRAM resistor of the disclosed RRAM device 200 is substantially increased while remaining the occupied horizontal area unchanged. For example, the active area of the RRAM resistor of the disclosed RRAM device 200 is increased by adding respective vertically extending portions (218-2 and 218-3 of FIG. 2J) of the variable resistive material layer 218 to couple at least the bottom electrode 212 while keeping horizontal area (or pitch) substantially unchanged. As such, within a given area of the disclosed RRAM device 200, the number of RRAM resistors that can be integrated into the RRAM device 200 may be substantially increased without sacrificing each RRAM resistor's performance (because the respective active area does not shrink).

In an embodiment, a memory cell includes: a first electrode comprising a top boundary and a sidewall; a resistive material layer, disposed above the first electrode, that comprises at least a first portion and a second portion coupled to a first end of the first portion; and a second electrode disposed above the resistive material layer, wherein the first portion of the resistive material layer extends along the top boundary of the first electrode and the second portion of the resistive material layer extends along an upper portion of the sidewall of the first electrode.

In another embodiment, a memory device includes: a first electrode partially embedded in a first dielectric layer; a resistive material layer conformally disposed over the protruding portion of the first electrode and a top surface of the first dielectric layer; and a second electrode disposed above the resistive material layer, wherein the resistive material layer includes a first portion sandwiched between the first and second electrodes.

Yet in another embodiment, a method includes: forming a first electrode comprising a top boundary and upper sidewalls that extend above a top boundary of a first dielectric layer; forming a resistive material layer that comprises a first portion extending along the upper sidewalls, a second portion coupled to one end of the first portion, and a third portion coupled to the other end of the first portion; and forming a second electrode extending through a second dielectric layer that overlays the first dielectric layer, wherein the second portion of the resistive material layer is sandwiched between the first and second electrodes.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a first dielectric layer;
a second dielectric layer disposed over the first dielectric layer;
a first electrode formed in the first dielectric layer and extending into the second dielectric layer, the first electrode comprising a top boundary, a first sidewall, a second sidewall and a bottom boundary;
a first capping layer formed to surround the top boundary, the first sidewall, the second sidewall and the bottom boundary of the first electrode;
a variable resistance material layer, disposed above the first capping layer; and
a second electrode disposed over the variable resistance material layer, wherein a first portion of the variable resistance material layer is disposed between a bottom boundary of the second electrode and the top boundary of the first electrode.

2. The memory cell of claim 1, wherein the variable resistance material layer further comprises a second portion coupled to a first end of the first portion and a third portion coupled to a second end of the first portion, the second end opposite the first end, wherein the first portion of the variable resistance material layer extends above and parallel to the top boundary of the first electrode and the second portion of the variable resistance material layer extends parallel to the first sidewall of the first electrode and the third portion of the variable resistance material layer extends parallel to the second sidewall of the first electrode.

3. The memory cell of claim 1, wherein the first and second electrodes each comprises a via structure.

4. The memory cell of claim 1, wherein the first and second electrodes are disposed at a same tier.

5. The memory cell of claim 1, further comprising:
a first electrode layer disposed above the first capping layer, wherein the first capping layer and the first electrode layer are disposed between the first electrode and the variable resistance material layer.

6. The memory cell of claim 5, further comprising:
a second capping layer extending parallel to the top boundary and parallel to the first and second sidewalls of the first electrode,
wherein the second capping layer and the second electrode layer are disposed between the variable resistive material layer and a second electrode disposed above the second capping layer.

7. A memory cell, comprising:
a first dielectric layer;
a second dielectric layer disposed over the first dielectric layer;
a first electrode formed in the first dielectric layer and extending into the second dielectric layer, the first electrode comprising a top boundary, a first sidewall, a second sidewall and a bottom boundary;
a first capping layer formed to surround the top boundary, the first sidewall, the second sidewall and the bottom boundary of the first electrode;
a resistive material layer conform ally disposed over the protruding portion of the first electrode and a top surface of the first dielectric layer; a second electrode disposed above the resistive material layer; and
a spacer disposed along a sidewall of the protruding portion of the first electrode and further over the top surface of the first dielectric layer.

8. The memory cell of claim 7, wherein the resistive material layer presents a variable resistance value and wherein the resistive material layer includes a first portion sandwiched between the first and second electrodes, a second portion extending parallel to a first side surface of the first electrode and a third portion extending parallel to a second side surface of the first electrode.

9. The memory cell of claim 7, further comprising:
a second dielectric layer disposed over the first dielectric layer, wherein the second electrode extends through the second dielectric layer.

10. The memory cell of claim 9, wherein the first and second dielectric layers are formed of a substantially similar material.

11. The memory cell of claim 7, wherein the first and second electrodes each comprises a via structure.

12. The memory cell of claim 7, further comprising:
a first electrode layer extending along the top boundary and sidewalls of the first electrode,
wherein the first capping layer and the first electrode layer are disposed between the first electrode and the resistive material layer.

13. The memory cell of claim 12, further comprising:
a second capping layer extending along the top boundary and sidewalls of the first electrode,
wherein the second capping layer and the second electrode layer are disposed between the resistive material layer and the second electrode.

14. A method, comprising:
forming a first dielectric layer;
forming a second dielectric layer over the first dielectric layer;
forming a first electrode in the first dielectric layer and extending into the second dielectric layer, the first electrode comprising a top boundary, a first sidewall, a second sidewall and a bottom boundary;
forming a first capping layer to surround the top boundary, the first sidewall, the second sidewall and the bottom boundary of the first electrode;
forming a resistive material layer over the first capping layer; and
forming a first electrode layer above the first capping layer, wherein the first capping layer and the first electrode layer are disposed between the first electrode and the resistive material layer.

15. The method of claim 14, further comprising:
forming a first spacer disposed adjacent the first upper sidewall of the first electrode in the second dielectric layer; and
forming a second spacer disposed adjacent the second upper sidewall of the first electrode in the second dielectric layer.

16. The method of claim 14, further comprising:
forming a second electrode extending through a second dielectric layer that overlays the first dielectric layer, wherein the first portion of the resistive material layer is sandwiched between the first and second.

17. The method of claim 16, further comprising:
forming a second capping layer above the second electrode layer, wherein the second capping layer and the second electrode layer are disposed between the resistive material layer and the second electrode.

18. The method of claim 14, wherein the resistive material layer presents a variable resistance value and wherein the resistive material layer includes a first portion sandwiched between the first and second electrodes, a second portion extending parallel to a first side surface of the first electrode and a third portion extending parallel to a second side surface of the first electrode.

19. The method of claim 14, wherein the first and second dielectric layers are formed of a substantially similar material.

20. The method of claim 14, wherein the first and second electrodes each comprises a via structure.

* * * * *